United States Patent
Giusti et al.

(10) Patent No.: US 12,187,600 B2
(45) Date of Patent: Jan. 7, 2025

(54) MEMS ACTUATOR AND MANUFACTURING PROCESS THEREOF

(71) Applicant: STMicroelectronics S.r.l., Agrate Brianza (IT)

(72) Inventors: Domenico Giusti, Caponago (IT); Carla Maria Lazzari, Lesmo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 57 days.

(21) Appl. No.: 17/903,473

(22) Filed: Sep. 6, 2022

(65) Prior Publication Data
US 2023/0070307 A1 Mar. 9, 2023

(30) Foreign Application Priority Data
Sep. 8, 2021 (IT) .......................... 102021000023240

(51) Int. Cl.
*H01L 41/04* (2006.01)
*B81B 3/00* (2006.01)
*F04B 43/04* (2006.01)

(52) U.S. Cl.
CPC ...... *B81B 3/0078* (2013.01); *B81B 2201/036* (2013.01); *F04B 43/046* (2013.01)

(58) Field of Classification Search
CPC ...... B81B 3/0078; F04B 43/046; H10N 30/20
USPC ........................................................ 310/328
See application file for complete search history.

(56) References Cited

U.S. PATENT DOCUMENTS

| 6,146,543 A | 11/2000 | Tai et al. |
| 2006/0056999 A1* | 3/2006 | East ...................... F04B 43/046 |
| | | 417/413.2 |
| 2008/0261345 A1 | 10/2008 | Villa et al. |
| 2016/0076530 A1* | 3/2016 | Chen ..................... F04B 45/047 |
| | | 417/413.2 |

OTHER PUBLICATIONS

IT Search Report and Written Opinion for priority application, IT 102021000023240, report dated May 16, 2022, 9 pgs.
Biitefisch, Sebastian, et al: "Novel Micro-Pneumatic Actuator for MEMS," Elsevier, Sensors and Actuators A 97-98 (2002) 638-645.
Cazorla, P.-H., et al: "Integration of PZT Thin Films on a Microfluidic Complex System," 2014 IEEE International Ultrasonics Symposium Proceedings, 491-494.

* cited by examiner

*Primary Examiner* — Derek J Rosenau
(74) *Attorney, Agent, or Firm* — Crowe & Dunlevy LLC

(57) ABSTRACT

A MEMS actuator includes a semiconductor body with a first surface defining a housing cavity facing the first surface and having a bottom surface, the semiconductor body further defining a fluidic channel in the semiconductor body with a first end across the bottom surface. A strainable structure extends into the housing cavity, is coupled to the semiconductor body at the bottom surface, and defines an internal space facing the first end of the fluidic channel and includes at least a first and a second internal subspace connected to each other and to the fluidic channel. When a fluid is pumped through the fluidic channel into the internal space, the first and second internal subspaces expand, thereby straining the strainable structure along the first axis and generating an actuation force exerted by the strainable structure along the first axis, in an opposite direction with respect to the housing cavity.

21 Claims, 14 Drawing Sheets

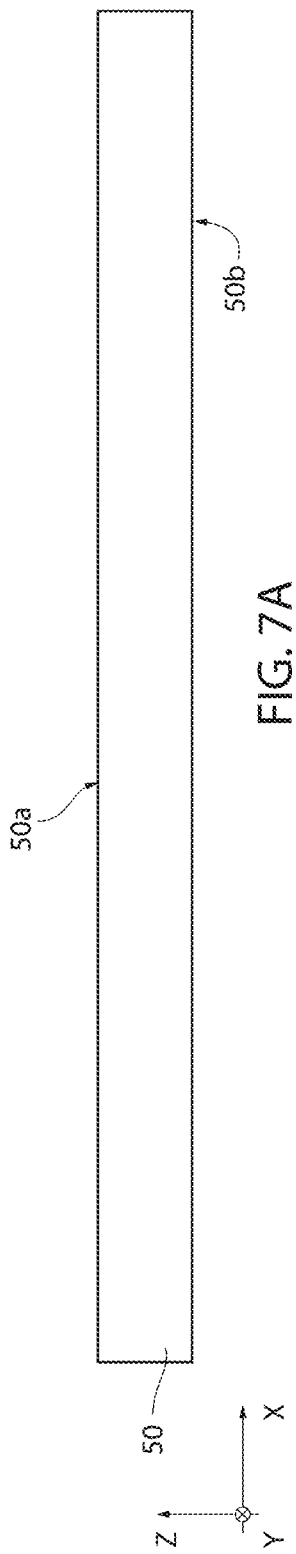
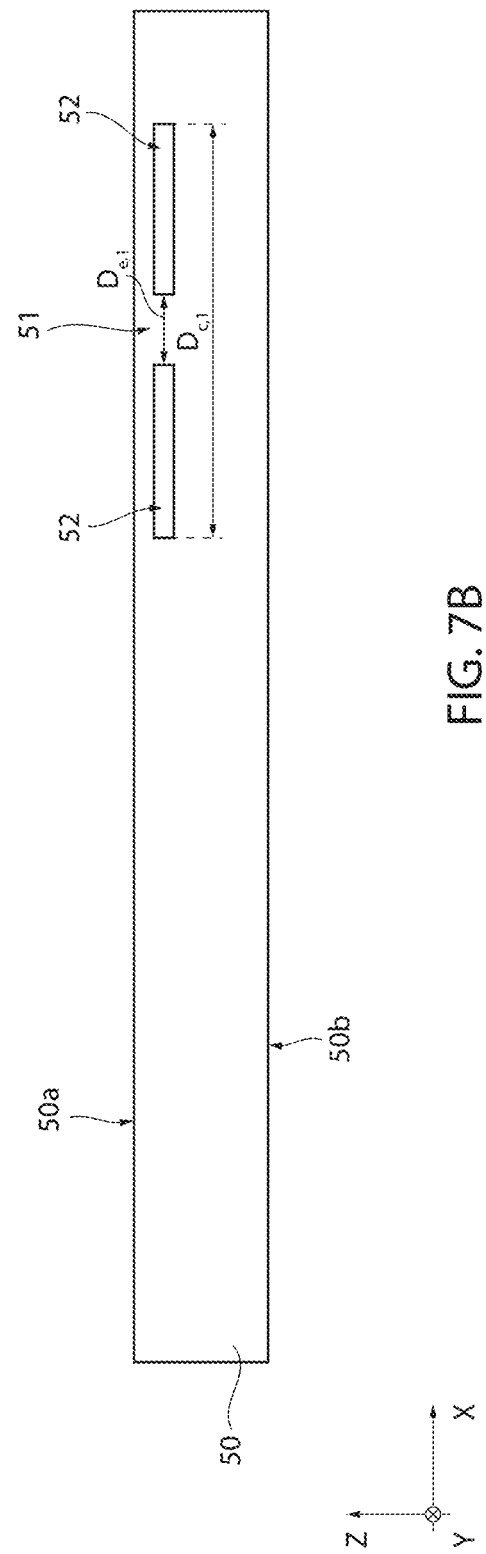

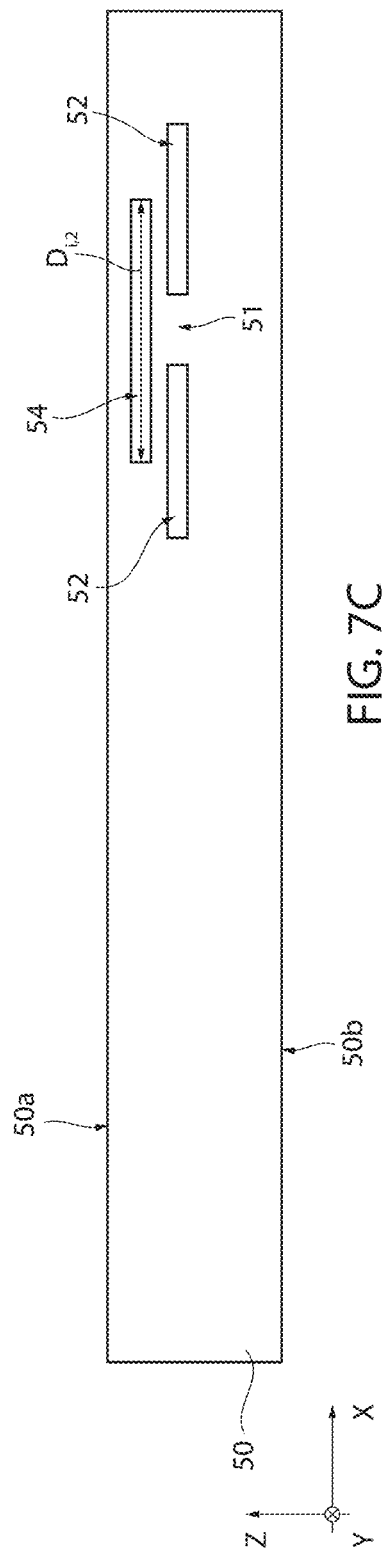
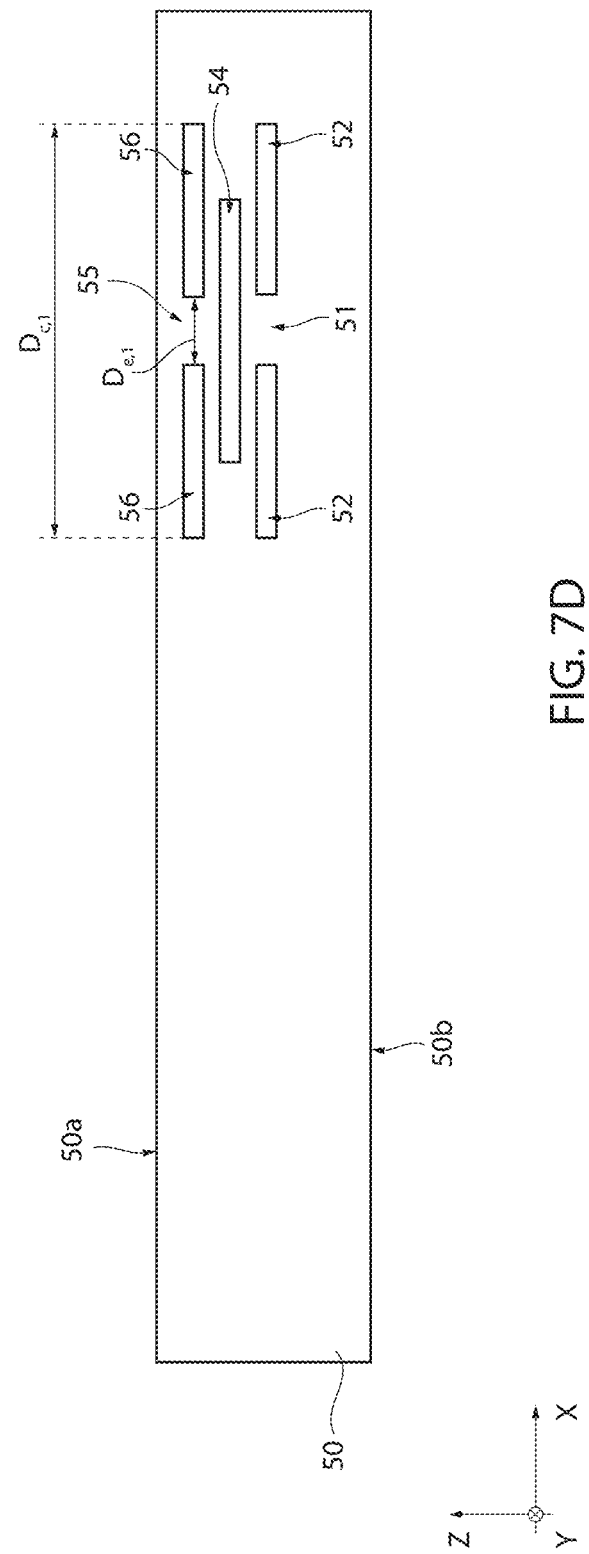
FIG. 7C
FIG. 7D

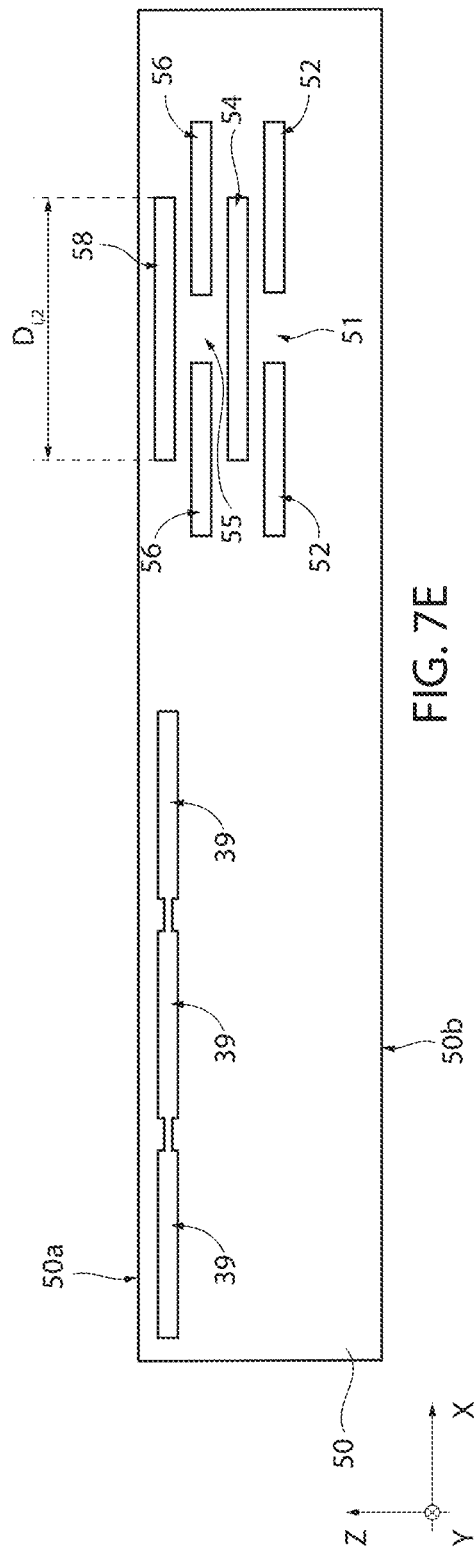
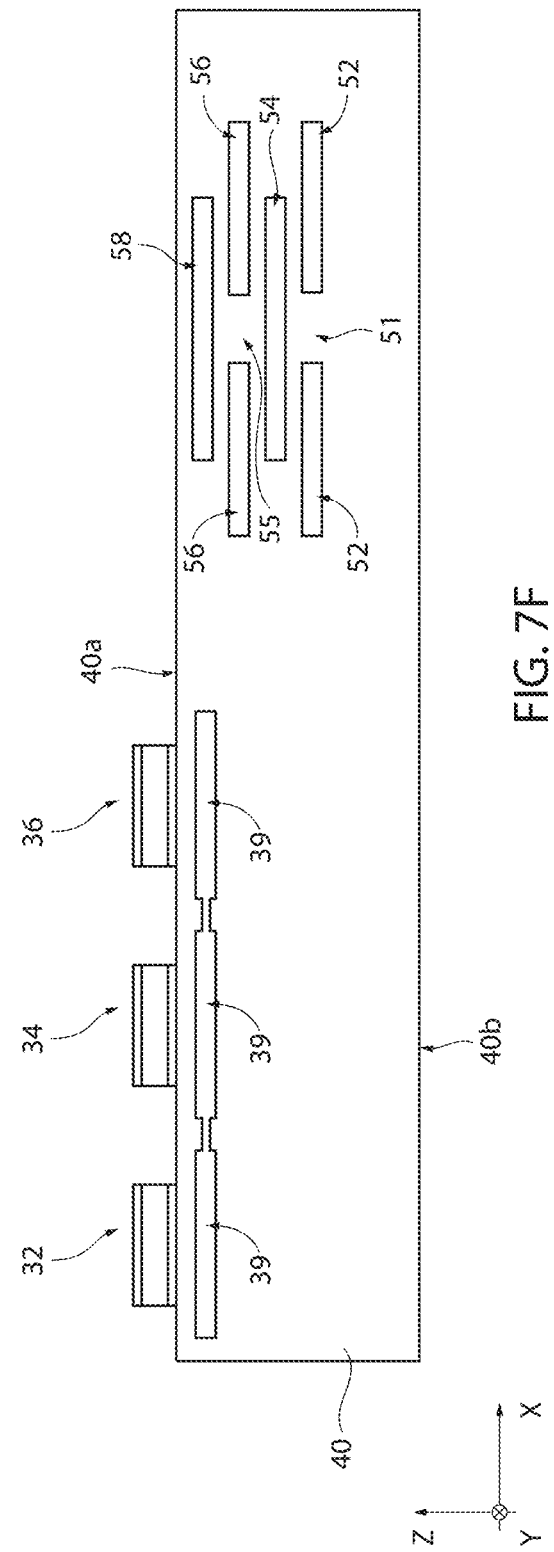
FIG. 7E
FIG. 7F

MEMS ACTUATOR AND MANUFACTURING PROCESS THEREOF

PRIORITY CLAIM

This application claims the priority benefit of Italian Application for Patent No. 102021000023240, filed on Sep. 8, 2021, the content of which is hereby incorporated by reference in its entirety to the maximum extent allowable by law.

TECHNICAL FIELD

This disclosure relates to a MEMS ("Micro Electro-Mechanical Systems") actuator and manufacturing process thereof. In detail, this disclosure relates to a MEMS actuator comprising a strainable structure that defines an internal space that expands when a fluid is pumped therein, generating a consequent strain of the strainable structure that allows an actuation force to be exerted on an external body present on the strainable structure. Furthermore, this disclosure relates to a manufacturing process of the MEMS actuator and to a control method thereof.

As is known, MEMS actuators are devices that convert energy from one form to another, that is, between physical variables different from each other. Examples of MEMS actuators are valves, switches, pumps, micro-motors of linear or rotary type, and allow, for example, an electrical quantity (e.g., voltage) to be converted into a mechanical quantity (e.g., a displacement, an elongation or a twist).

In particular, MEMS actuators (micro-actuators) of piezoelectric type are known which generate displacements following strains of the same caused by electric fields applied thereto.

However, known piezoelectric micro-actuators are capable of generating reduced forces, generally between about 10 mN and about 100 mN, which for some applications are not sufficient.

There is a need in the art to provide a MEMS actuator, a control method and a manufacturing process of the MEMS actuator that overcome the drawbacks of the prior art.

SUMMARY

In an embodiment, a MEMS actuator includes: a semiconductor body of semiconductor material having a first surface and a second surface opposite to each other along a first axis, and defining a housing cavity which faces the first surface of the semiconductor body and which has a bottom surface, opposite to the first surface of the semiconductor body along the first axis, and one or more lateral surfaces which join the bottom surface of the housing cavity to the first surface of the semiconductor body, the semiconductor body further defining a fluidic channel extending into the semiconductor body and having a first end extending through the bottom surface of the housing cavity; and a strainable structure which extends into the housing cavity, is coupled to the semiconductor body at the bottom surface of the housing cavity, extends at a distance from the one or more lateral surfaces of the housing cavity, has a top surface opposite to the bottom surface of the housing cavity with respect to the strainable structure, and defines an internal space which faces the first end of the fluidic channel and which comprises at least a first internal subspace and a second internal subspace superimposed on each other along the first axis and pneumatically connected to each other and to the fluidic channel. When a fluid is pumped through the fluidic channel into the internal space, the first internal subspace and the second internal subspace expand straining the strainable structure along the first axis and generating an actuation force exerted by the top surface of the strainable structure along the first axis, in an opposite direction with respect to the housing cavity.

The fluidic channel may have a second end opposite to the first end, and the MEMS actuator may also include a pumping assembly which extends into the fluidic channel between the first and second ends and is configured to pump the fluid into the internal space of the strainable structure.

The pumping assembly may include a first valve, one or more micro-pumps and a second valve, the one or more micro-pumps extending into the fluidic channel between the first valve and the second valve, and the second valve extending into the fluidic channel between the one or more micro-pumps and the strainable structure. The first and second valves may be controllable in an open position, wherein they allow flow of the fluid in the fluidic channel, or in a closed position, wherein they prevent the flow of the fluid in the fluidic channel. In addition, the one or more micro-pumps may be controllable in a rest position, wherein they do not have any deflection inside the fluidic channel, or in a pumping position, wherein they have deflection inside the fluidic channel.

Also disclosed herein is a method of controlling the MEMS actuator described above. The method includes steps of: a) controlling the first valve in the closed position, controlling the micro-pump in the rest position and controlling the second valve in the open position; b) controlling the first valve in the closed position, controlling the micro-pump in the pumping position and controlling the second valve in the open position; c) controlling the first valve in the closed position, controlling the micro-pump in the pumping position and controlling the second valve in the closed position; d) controlling the first valve in the open position, controlling the micro-pump in the pumping position and controlling the second valve in the closed position; e) controlling the first valve in the open position, controlling the micro-pump in the rest position and controlling the second valve in the closed position; and f) controlling the first valve in the closed position, controlling the micro-pump in the rest position and controlling the second valve in the closed position.

BRIEF DESCRIPTION OF THE DRAWINGS

For a better understanding, embodiments are now described, purely by way of non-limiting examples, with reference to the attached drawings, wherein:

FIGS. 7A-7I are lateral cross-section views illustrating steps of a manufacturing process of the MEMS actuator of FIG. 1;

DETAILED DESCRIPTION

Elements common to the different embodiments, described hereinbelow, are indicated with the same reference numbers.

Figure 1:
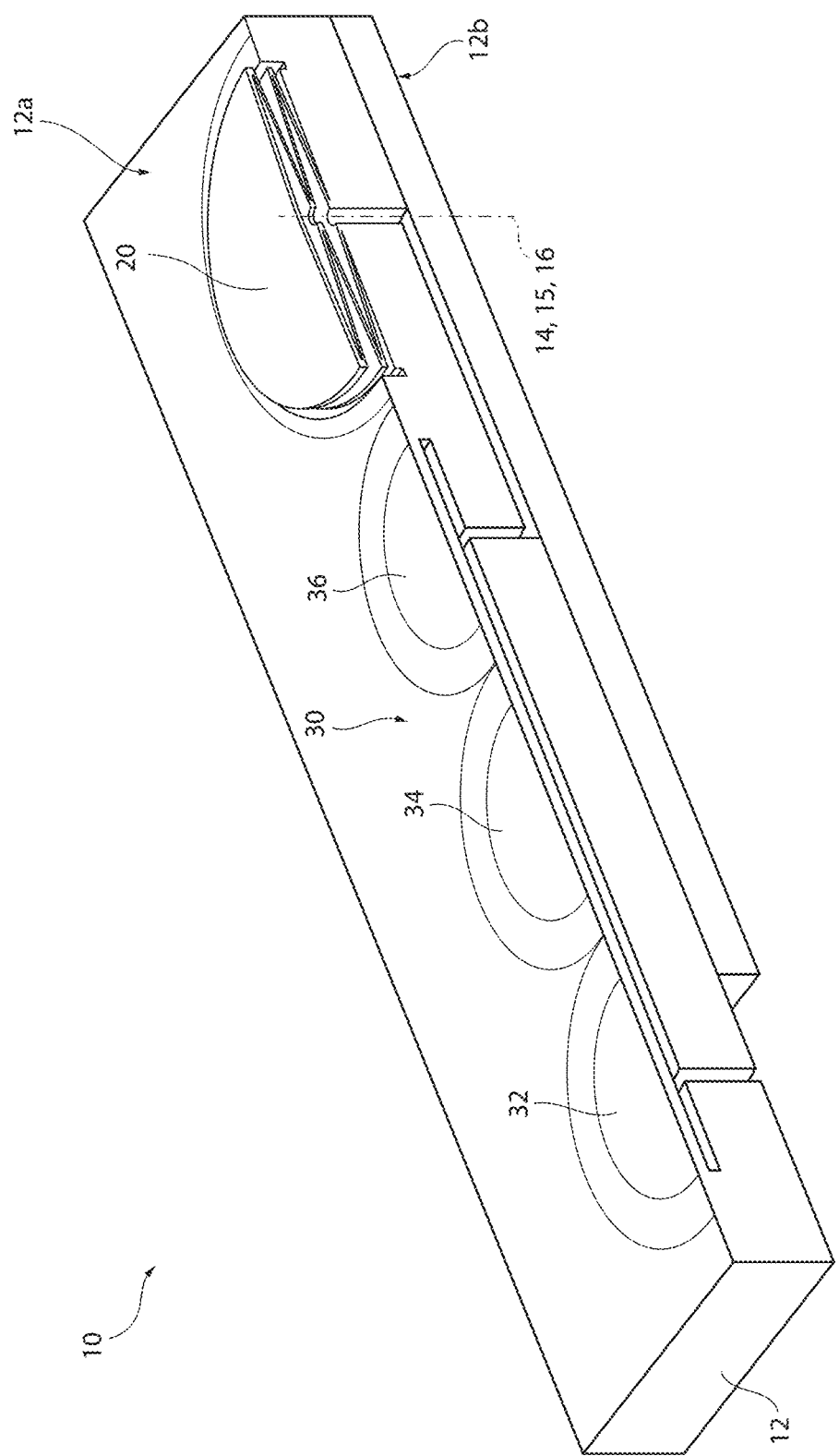
FIG. 1 is a perspective section of a MEMS actuator.

FIG. 1 shows, according to an embodiment and in a triaxial Cartesian reference system defined by X, Y and Z axes, an actuator (or micro-actuator) 10 made using MEMS technology and therefore hereinafter also called MEMS actuator 10.

The MEMS actuator 10 comprises: a semiconductor body 12 of semiconductor material (e.g., silicon), having a first surface 12a and a second surface 12b opposite to each other along the Z-axis; and a strainable structure 20 of semiconductor material (e.g., silicon) formed in the semiconductor body 12, for example at the first surface 12a.

In order to also illustrate the internal structure thereof, the MEMS actuator 10 is exemplarily shown in FIG. 1 and in the subsequent figures in section along an XZ-plane, defined by the axes X and Z, passing through a centerline axis (better discussed hereinbelow) of the strainable structure 20.

The strainable structure 20 is pneumatically controllable so as to strain elastically along a strain axis 14 transverse to the first surface 12a (in detail, in the present embodiment, it is orthogonal to the first surface 12a), consequently exerting an actuation force along the strain axis 14. In other words, the strainable structure 20 provides an element with variable volume, such as a pneumatic bellows.

Figure 2:
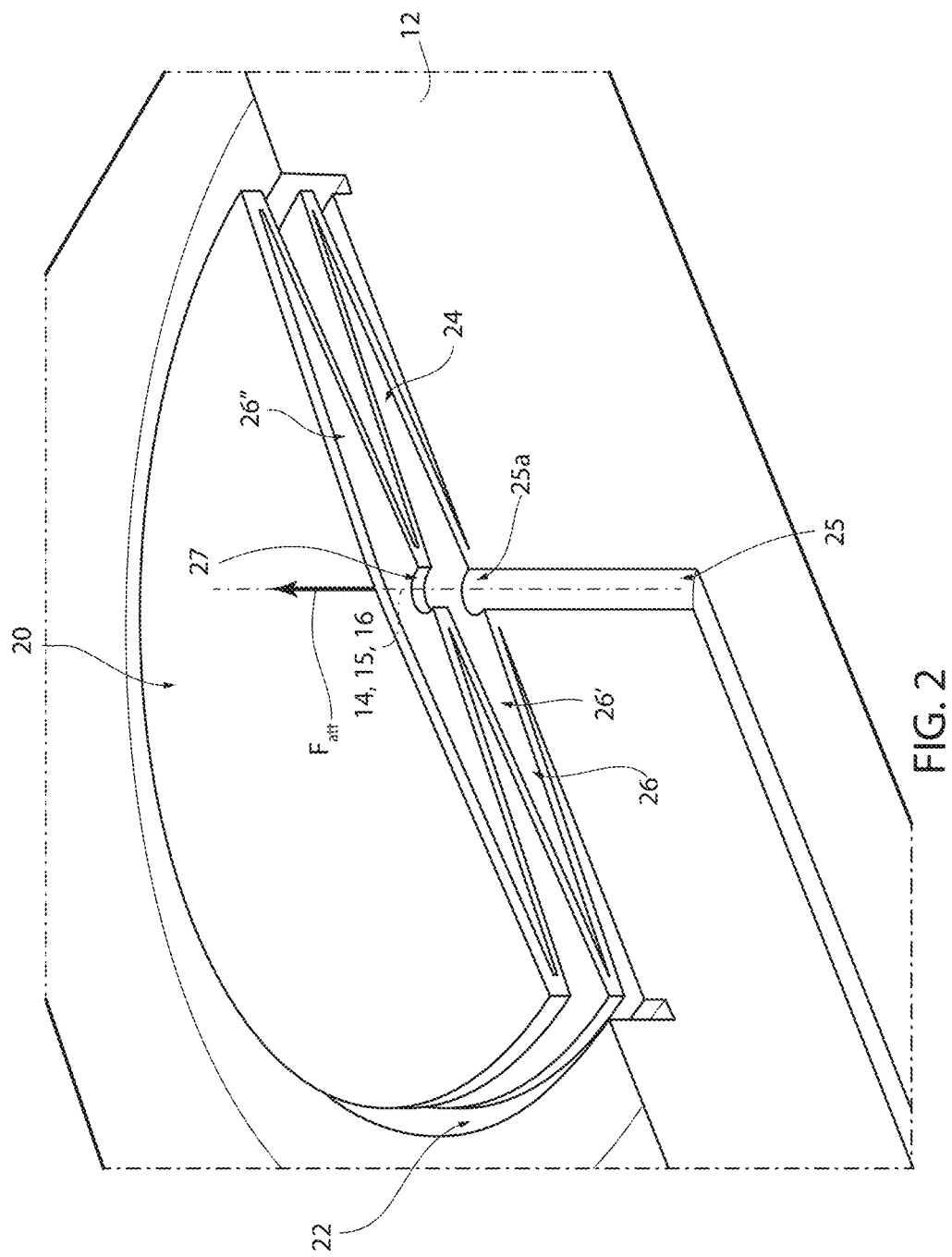
FIG. 2 is a perspective section of a strainable structure of the MEMS actuator of FIG. 1.
Figure 3:
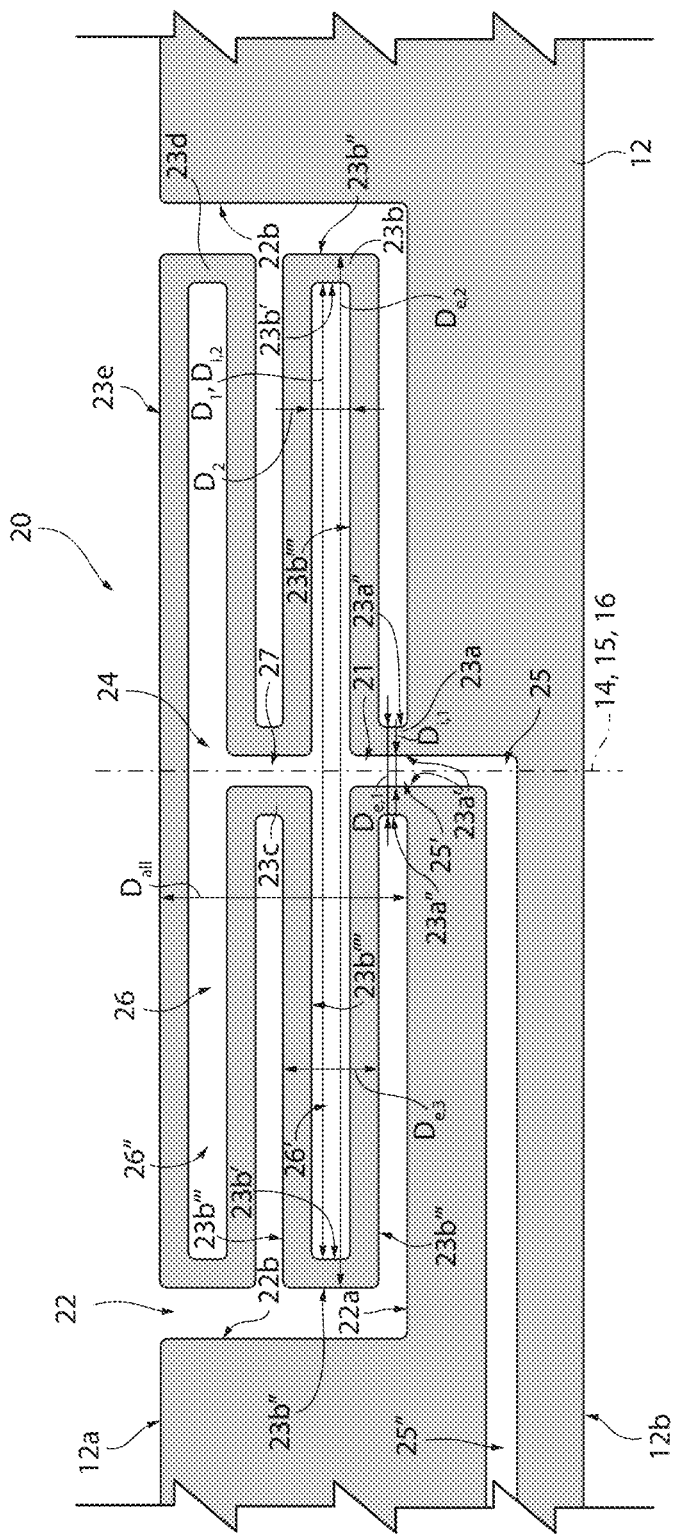
FIG. 3 is a lateral cross-section view of the strainable structure of FIG. 2.

In detail, as better shown in FIGS. 2 and 3, the strainable structure 20 extends into a housing cavity 22 of the semiconductor body 12, facing the top surface 12a. In particular, the strainable structure 20 is monolithic with the semiconductor body 12. In greater detail, the strainable structure 20 is physically coupled to a bottom surface 22a of the housing cavity 22 (opposite to the first surface 12a of the semiconductor body 12 with respect to the housing 22), and extends at a distant from lateral surfaces 22b of the housing cavity 22 (which join the bottom surface 22a to the first surface 12a of the semiconductor body 12).

The strainable structure 20 is a structure of semiconductor material which defines and externally delimits an internal space 24 of the strainable structure 20, and which has an opening 21 wherethrough the internal space 24 may pneumatically communicate with an environment external to the MEMS actuator 10. In other words, the strainable structure 20 has an annular section in an XY-plane (defined by the axes X and Y) and delimits the internal space 26 radially with respect to the Z-axis. In particular, the internal space 24 is in fluid connection with the external environment through a fluidic channel 25 which extends into the semiconductor body 12 defining a fluidic path. The fluidic channel 25 has a first end 25' which extends through the bottom surface 22a of the housing cavity 22 in continuity with the opening 21, faces the internal space 24 and has a second end 25" facing the external environment.

In particular, the strainable structure 20 is folded on itself along the Z-axis and defines one or more internal subspaces 26 (e.g., chambers) of the strainable structure 20. In the case of a plurality of internal subspaces 26, they are superimposed on each other along the Z-axis, are in fluid communication with each other through one or more fluidic communication holes 27 (each fluidic communication hole 27 connecting two internal subspaces 26 contiguous to each other), and together form the internal space 24. For example, the one or more fluidic communication holes 27 are aligned, along the Z-axis, with each other and with the first end 25' of the fluidic channel 25.

Purely by way of example, FIG. 2 shows a first internal subspace 26' and a second internal subspace 26" connected through a fluidic communication hole 27, although the number of internal subspaces 26 may be similarly smaller (i.e., one internal subspace 26) or greater (i.e., three or more internal subspaces 26) and the number of fluidic communication holes 27 may vary accordingly.

The strainable structure 20 also has a centerline axis 15 parallel to the Z-axis (in detail, an axis orthogonal to the XY-plane passing through a center, in the XY-plane, of the strainable structure 20), exemplarily shown coinciding with the strain axis 14.

In the embodiment of FIG. 2, the strainable structure 20 is symmetrical with respect to the centerline axis 15; the fluidic communication hole 27 and the opening 21 are aligned with each other and concentric along the centerline axis 15.

By way of example, the strainable structure 20 has a circular shape parallel to the XY-plane, although different polygonal shapes may be similarly considered as better described hereinbelow.

FIG. 3 shows the strainable structure 20 in a rest condition, that is, in a condition wherein no fluid (hereinafter, air is exemplarily considered) is pumped into the internal space 24 and therefore the strainable structure 20 is not strained by an expansion force due to this pumping, as better discussed hereinbelow. In the rest condition, the strainable structure 20 is in a rest position.

The strainable structure 20 has an annular shape parallel to the XY-plane and has, in a section along an XZ-plane defined by the axes X and Z (similarly, along a YZ-plane defined by the axes Y and Z), a plurality of folds that define the first and second internal subspaces 26' and 26".

In detail, the first and second internal subspaces 26' and 26" are respective cavities that extend into the strainable structure 20, and have a main extension parallel to the XY-plane. For example, each internal subspace 26' and 26" has a first maximum dimension $D_1$ along the Y axis or X axis (measured between first internal surfaces 23b' of the strainable structure 20 opposite to each other along the X-axis or Y-axis and facing the respective internal subspace 26', 26") and a second maximum dimension $D_2$ along the Z-axis (measured between second internal surfaces 23b'''' of the strainable structure 20 opposite to each other along the Z-axis and facing the respective internal subspace 26', 26") being smaller than the first maximum dimension $D_1$. For example, a ratio between the second maximum dimension $D_2$ and the first maximum dimension $D_1$ is less than about 6%.

In particular, the strainable structure 20 comprises: a first connecting portion 23a which joins the strainable structure 20 to the semiconductor body 12, at the bottom surface 22a of the housing cavity 22, and which defines the opening 21; a first straining portion 23b which is joined to the first connecting portion 23a on the opposite side of the latter with respect to the bottom surface 22a of the housing cavity 22, and which defines the first internal subspace 26'; a second connecting portion 23c which is joined to the first straining portion 23b on the opposite side of the latter with respect to the first connecting portion 23a, and which defines the fluidic communication hole 27 which connects the first internal subspace 26' to the second internal subspace 26"; and a second straining portion 23d which is joined to the second connecting portion 23c on the opposite side of the latter with respect to the first straining portion 23b, and which defines the second internal subspace 26". The straining portions 23b and 23d extend at a distance, along the Z-axis, both from each other and with respect to the bottom surface 22a of the housing cavity 22, due to the respective connecting portions 23a and 23c. In addition, the fluidic channel 25 extends in continuation with the opening 21, thus facing the first internal subspace 26'.

In greater detail, each connecting portion 23a, 23c has, parallel to the XY-plane, an annular shape defined by a first maximum internal dimension $D_{i,1}$ (measured parallel to the XY-plane, therefore orthogonally to the Z-axis, and for example along the X-axis, between internal surfaces 23a' of the connecting portion 23a, 23c which are opposite to each other along the X-axis and which face the fluidic channel 25 and, respectively, the fluidic communication hole 27) and by a first maximum external dimension $D_{e,1}$ (measured parallel to the XY-plane, for example along the X-axis, between external surfaces 23a" of the connecting portion 23a, 23c which are opposite to each other along the X-axis and which face the housing cavity 22) being greater than the first maximum internal dimension $D_{i,1}$. Furthermore, each straining portion 23b, 23d has, at its respective internal subspace 26', 26" and parallel to the XY-plane, an annular shape defined by a second maximum internal dimension $D_{i,2}$ (measured parallel to the XY-plane, for example along the X-axis, between the first internal surfaces 23b' of the straining portion 23b, 23d which are opposite to each other along the X-axis and which face the respective internal subspace 26', 26") and by a second maximum external dimension $D_{e,2}$ (measured parallel to the XY-plane, for example along the X-axis, between first external surfaces 23b" of the straining portion 23b, 23d which are opposite to each other along the X-axis and which face the housing cavity 22) being greater than the second maximum internal dimension $D_{i,2}$. Here, the second maximum internal dimension $D_{i,2}$ is equal to the aforementioned first maximum dimension $D_1$. Furthermore, the relations $D_{i,1}<D_{i,2}$ and $D_{e,1}<D_{e,2}$, apply, and in greater detail the relation $D_{i,1}<D_{e,1}<D_{i,2}<D_{e,2}$ applies. Furthermore, each straining portion 23b, 23d has, parallel to the Z-axis, a third maximum external dimension $D_{e,3}$ (measured along the Z-axis, between second external surfaces 23''' of the straining portion 23b, 23d which are opposite to each other along the Z-axis and which face the housing cavity 22) which is greater than the second maximum dimension $D_2$ and smaller than the second maximum external dimension $D_{e,2}$. For example, a ratio between the third maximum external dimension $D_{e,3}$ and the second maximum external dimension $D_{e,2}$ is less than about 6%.

In FIG. 3, for sake of simplicity, the maximum internal dimensions $D_{i,1}$, $D_{i,2}$ and the maximum external dimensions $D_{e,1}$, $D_{e,2}$ have been indicated for the first connecting portion 23a and for the first straining portion 23b, although they are clearly and similarly applicable also to the second connecting portion 23c and to the second straining portion 23d.

Furthermore, the first connecting portion 23a and the second connecting portion 23c are concentric with each other and symmetrical with respect to a symmetry axis 16 which, in the embodiment of FIGS. 2 and 3, coincides with the centerline axis 15.

Purely by way of example, the first maximum internal dimension $D_{i,1}$ is comprised between about 5 μm and about 100 μm, the first maximum external dimension $D_{e,1}$ is comprised between about 50 μm and about 500 μm, the second maximum internal dimension $D_{i,2}$ is comprised between about 200 μm and about 1000 μm, the second maximum external dimension $D_{e,2}$ is comprised between about 300 μm and about 2000 μm.

For example, in the present embodiment wherein the strainable structure 20 has a circular shape parallel to the XY-plane (i.e., said annular sections have a circular shape), the maximum internal dimensions $D_{i,1}$, $D_{i,2}$ coincide with a smaller diameter than the annular sections of the connecting portions 23a, 23c and, respectively, of the straining portions 23b, 23d, while the maximum external dimensions $D_{e,1}$, $D_{e,2}$ coincide with a greater diameter than the annular sections of the connecting portions 23a, 23c and, respectively, of the straining portions 23b, 23d.

Furthermore, the strainable structure 20 has a top surface 23e (here a top surface of the second straining portion 23d, extending on the opposite side of the second straining portion 23d with respect to the first straining portion 23b) which, in the rest position of the strainable structure 20, is aligned, along the Z-axis, with the first surface 12a of the semiconductor body 12.

In use, the strainable structure 20 is used as an actuator. In particular, air is inserted (actively pumped) through the fluidic channel 25 into the internal space 24, as better described hereinbelow. This pumping of air generates said expansion force (not shown) operating, radially with respect to the internal space 24 and to the outside, on the strainable structure 20 (in detail, on the internal surfaces of the strainable structure 20 that face the internal space 24). The expansion force causes a strain of the strainable structure 20 along the strain axis 14, and therefore an increase in the volume of the internal space 24, which leads the top surface 23e of the strainable structure 20 to move away from the semiconductor body 12.

In other words, the strainable structure 20 has a maximum elongation dimension $D_{all}$ along the Z-axis (i.e., a maximum length along the Z-axis, for example measured between the top surface 23e of the strainable structure 20 and the bottom surface 22a of the housing cavity 22); when the strainable structure 20 is in rest position (e.g., FIG. 3), the internal space 24 has a first volume and the maximum elongation dimension $D_{all}$ has a first value; when the strainable structure 20 is stressed and strained due to the pumping of air into the internal space 24 (e.g., FIG. 2), the strainable structure 20 is in an own elongation position (different from the rest position), the internal space 24 has a second volume being greater than the first volume and the maximum elongation dimension $D_{all}$ has a second value being greater than the first value.

In detail, given the shape of the strainable structure 20 along the Z-axis, this strain occurs mainly along the strain axis 14 to the outside of the housing cavity 22 (i.e., in the opposite direction with respect to the bottom surface 22a). Furthermore, in an almost negligible manner, the strainable structure 20 also strains parallel to the XY-plane, in detail being subject to contraction along the axes X and Y with respect to when it is in rest condition.

As a result of the elongation of the strainable structure 20 along the Z-axis as the pressure in the internal space 24 increases, the strainable structure 20 exerts, at the top surface 23e, said actuation force (indicated in FIG. 2 with the reference $F_{att}$) along the strain axis 14, to the outside of the housing cavity 22. Consequently, an external body arranged on the top surface 23e will be subject to the effect of this actuation force $F_{att}$ and will be raised (i.e., moved away along the Z-axis with respect to the semiconductor body 12).

With reference to FIG. 1 and according to an embodiment, the MEMS actuator 10 further comprises a pumping assembly 30 which extends into the semiconductor body 12 (for example at the first surface 12a) along the fluidic path defined by the fluidic channel 25, is pneumatically coupled to the strainable structure 20 and is controllable to pump air into the strainable structure 20 so as to cause the strain thereof.

In detail, the pumping assembly 30 comprises a first valve 32, a micro-pump 34 and a second valve 36, arranged in succession with each other and in pneumatic connection both with each other and with the strainable structure 20.

In particular, the micro-pump 34 and the first and second valves 32 and 36 extend along the fluidic path and allow the pumping of air from the external environment to the internal space 24. Along this fluidic path, the micro-pump 34 is interposed between the first and second valves 32 and 36, and the second valve 36 is interposed between the micro-pump 34 and the strainable structure 20.

The first valve 32, the micro-pump 34 and the second valve 36 are made using MEMS technology and are of a known type. In particular, they are of piezoelectric type, and for example exploit piezoelectric thin films.

Figure 4:
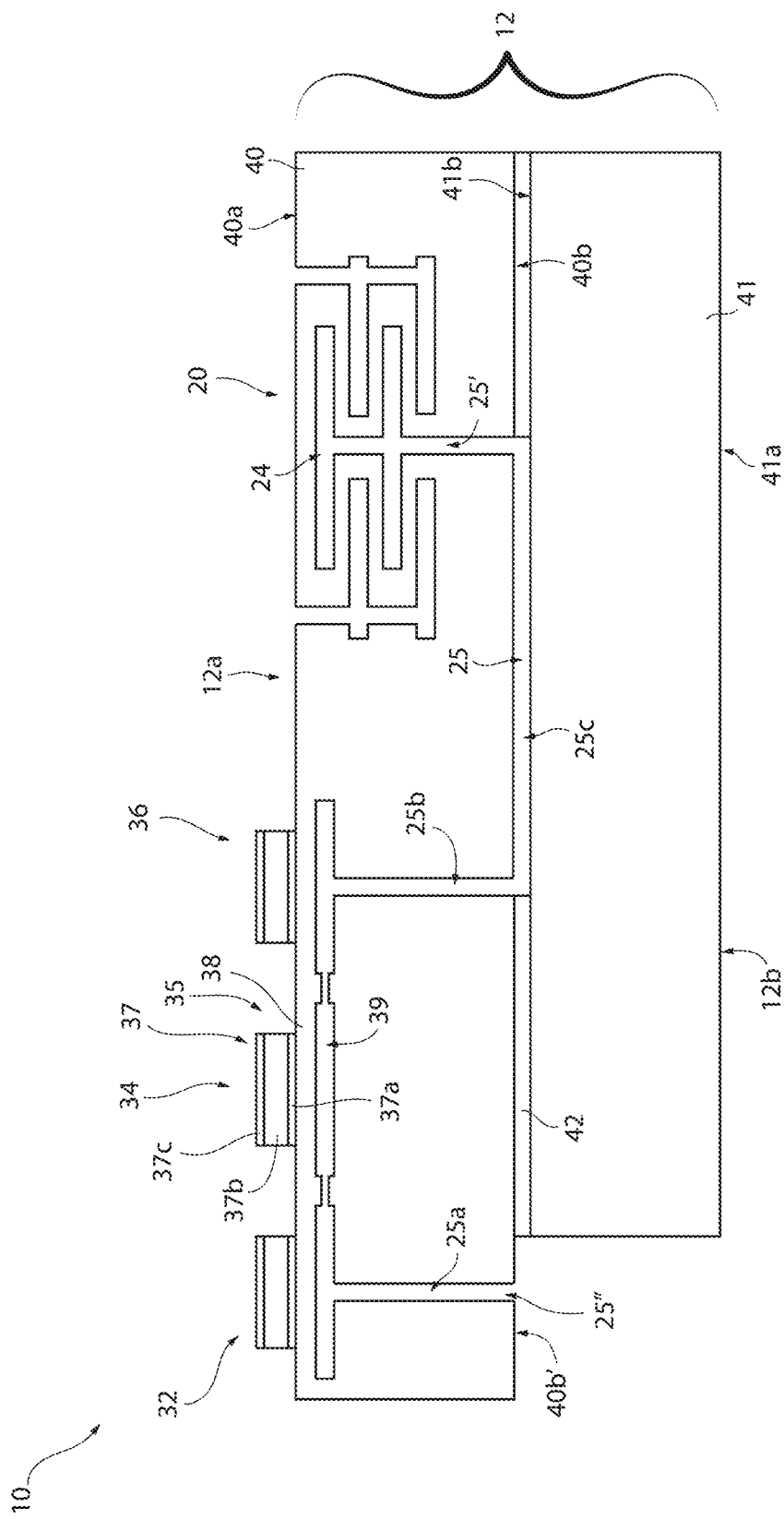
FIG. 4 is a lateral cross-section view of the MEMS actuator of FIG. 1.

In detail, as better shown in FIG. 4, the semiconductor body 12 comprises a first substrate 40 and a second substrate 41, both of semiconductor material such as silicon, coupled with each other through a bonding layer 42 (e.g., blanker wafer or polymeric layer, to allow permanent bonding). In particular, the first substrate 40 has a first surface 40a and a second surface 40b opposite to each other along the Z-axis, the second substrate 41 has a first surface 41a and a second surface 41b opposite to each other along the Z-axis, and the bonding layer 42 extends in contact with the second surfaces 40b and 41b of the substrates 40 and 41, which therefore face each other through the bonding layer 42.

Furthermore, the first substrate 40 has a region which is laterally offset with respect to the second substrate 41 (i.e., it is not vertically superimposed, along the Z-axis, on the second substrate 41), so as not to face the second substrate 41 and to leave exposed a first exposed region 40b' of the second surface 40b of the first substrate 40. The first surface 40a of the first substrate 40 forms the first surface 12a of the semiconductor body 12, while the first surface 41a of the second substrate 41 and the first exposed region 40b' of the second surface 40b of the first substrate 40 form the second surface 12b of the semiconductor body 12.

The first valve 32, the micro-pump 34 and the second valve 36 extend at the first surface 12a of the semiconductor body 12.

In detail, the first valve 32, the micro-pump 34 and the second valve 36 have a similar structure, which is exemplarily described with reference to the micro-pump 34 although it is similarly applicable to the first and second valves 32, 36 as well. In greater detail, the micro-pump 34 comprises an actuation structure 37 of piezoelectric type, extending on a membrane body 38 suspended on a buried cavity 39 present in the semiconductor body 12, at the first surface 12a. The actuation structure 37 comprises a first electrode 37a on the first surface 12a of the semiconductor body 12 (e.g., in contact therewith), a piezoelectric layer 37b superimposed on the first electrode 37a and a second electrode 37c superimposed on the piezoelectric layer 37b (i.e., extending on the opposite side of the latter with respect to the first electrode 37a).

In use, the electrodes 37a and 37c are set to respective voltages so as to bias the piezoelectric layer 37b arranged therebetween which, due to the inverse piezoelectric effect, strains towards the underlying buried cavity 39. Since the actuation structure 37 is integral with the membrane body 38 and forms a membrane 35 therewith, the strain of the piezoelectric layer 37b causes a strain of the entire membrane 35 towards the buried cavity 39.

The buried cavities 39 of the first valve 32, of the micro-pump 34 and of the second valve 36 are in fluidic communication with each other and form part of the fluidic channel 25.

Consequently, in use, the first and second valves 32, 36 exploit this strain of the membrane 35 to occlude (in detail, completely obstruct) the fluidic channel 25 at the respective buried cavity 39. This prevents fluidic and pneumatic communication in the fluidic channel 25 between the inlet and the outlet of the valve 32, 36, i.e., separates the fluidic channel 25 into two zones pneumatically insulated from each other. Instead, the micro-pump 34 exploits this strain of the membrane 35, in combination with the valves 32 and 36 as better described hereinbelow, to apply a pressure to the air present between the first and second valves 32, 36, so as to generate a pressure gradient in the fluidic channel 25 which causes the displacement of air in the internal space 24 of the strainable structure 20.

In other words, each valve 32, 36 is operable in an open state (open position of the valve 32, 36, corresponding to a rest condition of the valve 32, 36, i.e., absence of bias and therefore absence of strain of the respective piezoelectric layer 37b) or in a closed state (closed position of the valve 32, 36, corresponding to a work condition of the valve 32, 36, i.e., bias and therefore strain of the respective piezoelectric layer 37b); furthermore, the micro-pump 34 is operable in an inactive state (rest position of the micro-pump 34, corresponding to a condition of bias absence and therefore absence of strain of the respective piezoelectric layer 37b) or in an active state (pumping or deflected position of the micro-pump 34, corresponding to a work condition of the micro-pump 34, i.e., bias and therefore strain of the piezoelectric layer 37b). For example, in the open or inactive state, the membranes 35 of the valves 32 and 36 and of the micro-pump 34 have intrinsic compressive stresses of the piezoelectric layer 37b which cause a strain of the same membranes 35 in the opposite direction with respect to the buried cavities 39 (i.e., towards the external environment); in the closed or active state, the membranes 35 of the valves 32 and 36 and of the micro-pump 34 are subject to tensile stresses of the piezoelectric layers 37b, caused by the inverse piezoelectric effect, which oppose the compressive stresses and generate the strain of the membranes 35 towards the buried cavities 39 (i.e., within the latter).

The fluidic channel 25 has the second end 25" facing the first exposed region 40b', and extends into the first substrate 40 until reaching the internal space 24 of the strainable structure 20.

In particular, a first portion 25a of the fluidic channel 25 extends, mainly parallel to the Z-axis, from the first exposed region 40b' up to the buried cavity 39 of the first valve 32, thus traversing most of the first substrate 40 along the Z-axis. Then, the buried cavities 39 of the first valve 32, of the micro-pump 34 and of the second valve 36 follow along the fluidic channel 25. The fluidic channel 25 then comprises a second portion 25b which extends, mainly parallel to the Z-axis, from the buried cavity 39 of the second valve 36 up to a third portion 25c of the fluidic channel 25, which has a main extension direction parallel to the X-axis and which extends in contact with part of the second surface 41b of the second substrate 41 until reaching the opening 21 facing the internal space 24.

Figure 5A:
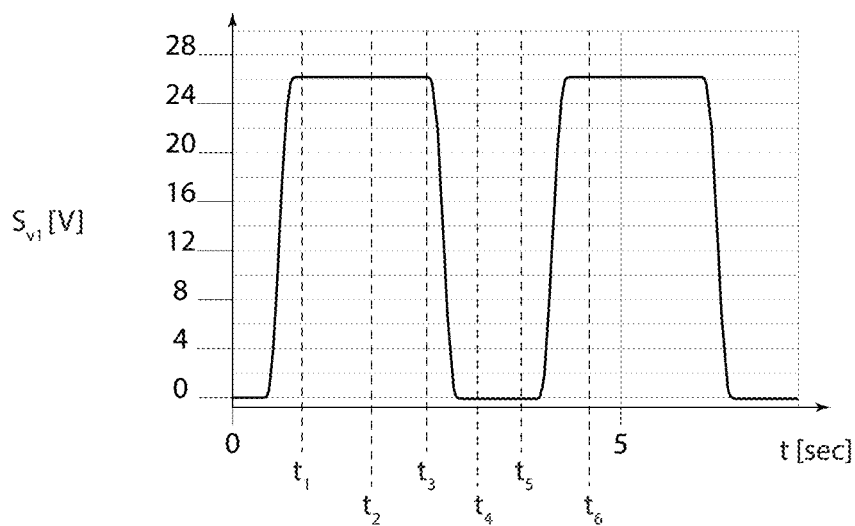
FIGS. 5A-5C are graphs showing control signals of elements of the MEMS actuator of FIG. 1.
Figure 5B:
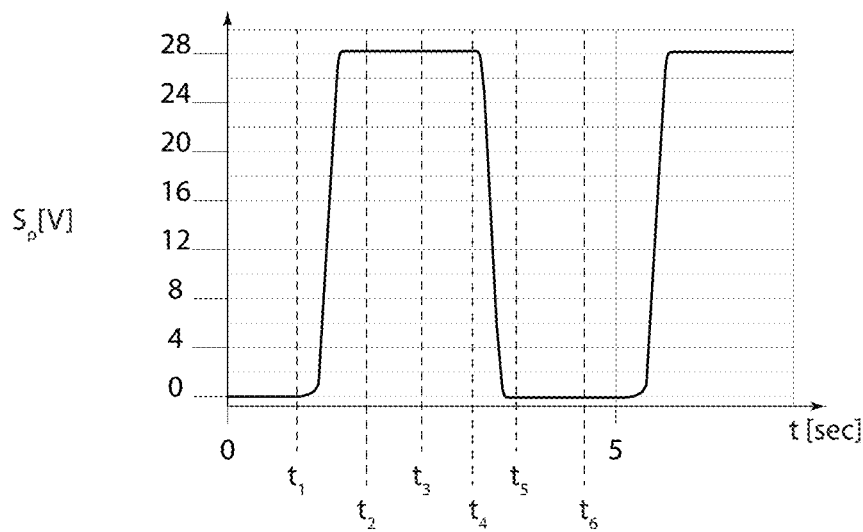
Figure 5C:
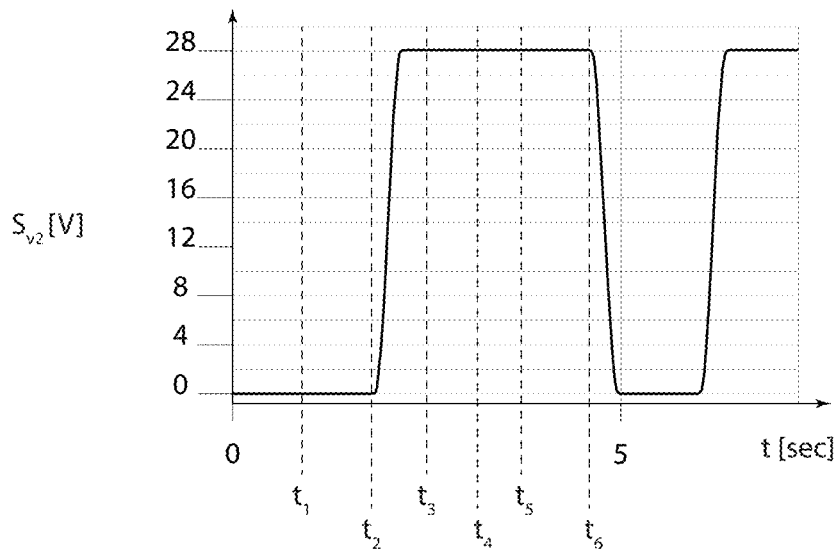
Figure 6:
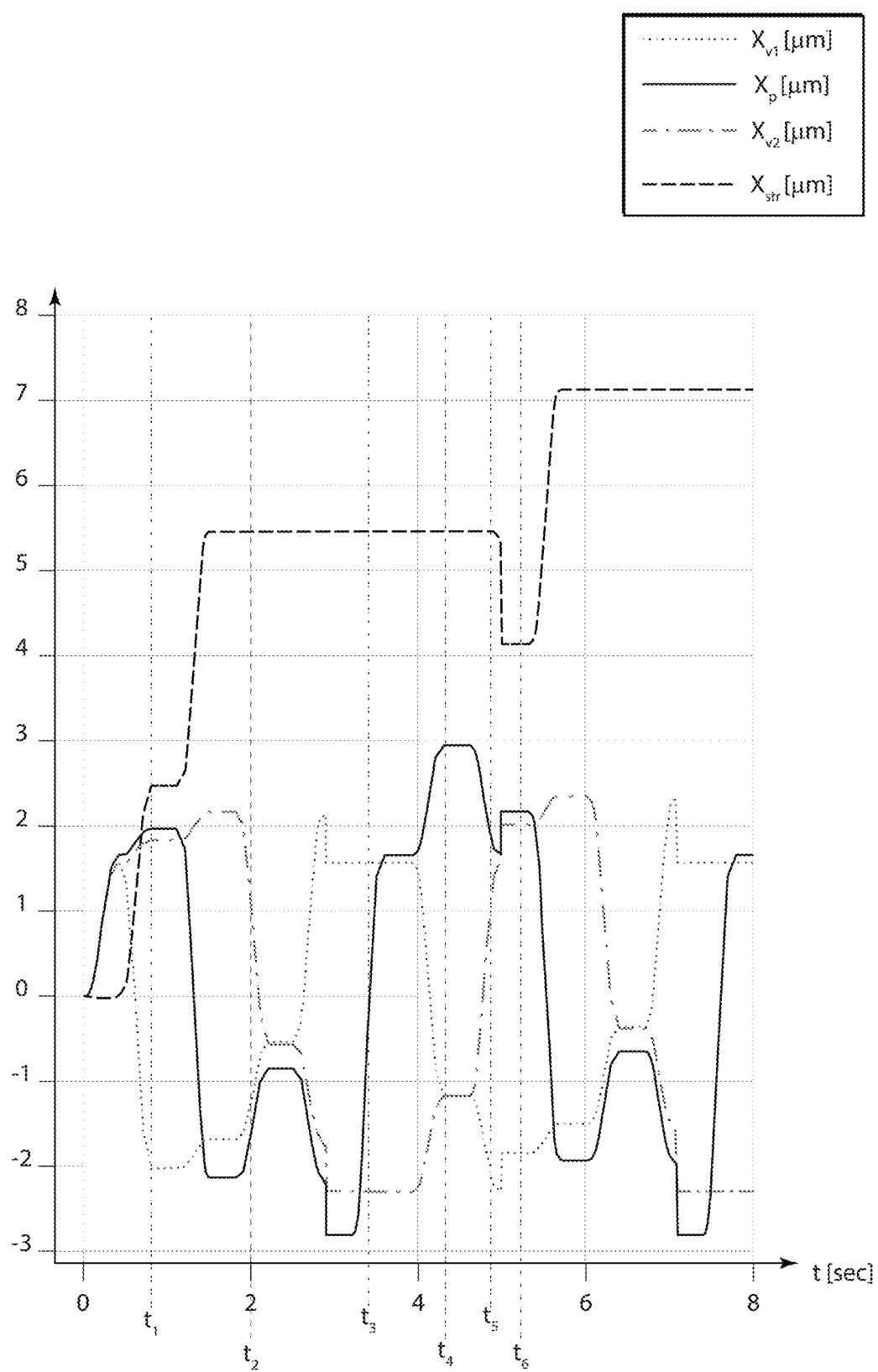
FIG. 6 is a graph showing displacement signals of said elements of the MEMS actuator of FIG. 1.

A control method of the MEMS actuator 10 is now described, with reference to FIGS. 5 and 6.

In detail, FIGS. 5A-5C are graphs showing the trend, as a function of time, of control signals $S_{v1}$, $S_p$, $S_{v2}$ of the first valve 32, of the micro-pump 34 and of the second valve 36, respectively. These control signals $S_{v1}$, $S_p$, $S_{v2}$ are provided from the outside of the MEMS actuator 10 (e.g., by an external biasing module electrically couplable to the electrodes 37a and 37c of the first valve 32, of the micro-pump 34 and of the second valve 36) and are for example voltage signals, in detail the potential difference applied to the electrodes 37a and 37c to control the first valve 32, the micro-pump 34 or the second valve 36. For example, each of the control signals $S_{v1}$, $S_p$, $S_{v2}$ may vary between a respective first value (indicative of the open state of the first valve 32, of the inactive state of the micro-pump 34 and of the open state of the second valve 36, respectively, and e.g., equal to about 0 V) and a respective second value (indicative of the closed state of the first valve 32, of the active state of the micro-pump 34 and of the closed state of the second valve 36, respectively, and e.g., equal to about 28-30 V).

Furthermore, FIG. 6 is a graph showing the trend, as a function of time, of displacement signals $X_{v1}$, $X_p$, $X_{v2}$, and $X_{str}$ of the first valve 32, of the micro-pump 34, of the second valve 36 and of the strainable structure 20, respectively. These displacement signals $X_{v1}$, $X_p$, $X_{v2}$, and $X_{str}$ are indicative of displacements, measured along the Z-axis of the first valve 32, of the micro-pump 34, of the second valve 36 and of the strainable structure 20, from the respective positions in rest condition. For example, the displacement signal $X_{v1}$ refers to the displacement, along the Z-axis, of the membrane 35 of the first valve 32 with respect to its rest position (e.g., displacement of the membrane body 38 in the buried cavity 39), i.e., when the respective piezoelectric layer 37b is not biased; instead, the displacement signal $X_{v1}$ refers to the displacement, along the Z-axis, of the top surface 23e of the strainable structure 20 with respect to its rest position, i.e., when no air is pumped into the internal space 24 (in other words, it is equal to the difference between the maximum elongation dimension $D_{all}$ of the strainable structure 20 in the elongation position and the maximum elongation dimension $D_{all}$ of the strainable structure 20 in the rest position).

In particular, the control method of the MEMS actuator 10 comprises one or more iterations performed in succession with each other. The first iteration begins with the MEMS actuator 10 in a rest condition (i.e., when no pumping of air is performed in the internal space 24, and therefore the first valve 32 is in the open state, the micro-pump 34 is in the inactive state and the second valve 36 is in the open state). Each iteration comprises, in succession with each other:

a) closing the first valve 32, leaving the micro-pump 34 inactive and leaving the second valve 36 open (i.e., $S_{v1}$ assumes the second value, $S_p$ assumes the first value and $S_{v2}$ assumes the first value, as shown at instant $t_1$), so that the part of the fluidic channel 25 after the first valve 32 is pneumatically decoupled from the part of the fluidic channel 25 before the first valve 32;

b) leaving the first valve 32 closed, activating the micro-pump 34 and leaving the second valve 36 open (i.e., $S_{v1}$ assumes the second value, $S_p$ assumes the second value and $S_{v2}$ assumes the first value, as shown at instant $t_2$), so that the micro-pump 34 pumps air towards the internal space 24 (the value of the displacement signal $X_{str}$ increases with respect to step a);

c) leaving the first valve 32 closed, leaving the micro-pump 34 active and closing the second valve 36 (i.e., $S_{v1}$ assumes the second value, $S_p$ assumes the second value and $S_{v2}$ assumes the second value, as shown at instant $t_3$), so that the part of the fluidic channel 25 after the second valve 36 is pneumatically decoupled from the part of the fluidic channel 25 before the second valve 36;

d) opening the first valve 32, leaving the micro-pump 34 active and leaving the second valve 36 closed (i.e., $S_{v1}$ assumes the first value, $S_p$ assumes the second value and $S_{v2}$ assumes the second value, as shown at instant $t_4$), so that the part of the fluidic channel 25 comprised between the first and second valves 32 and 36 is back in fluid communication with the external environment;

e) leaving the first valve 32 open, deactivating the micro-pump 34 and leaving the second valve 36 closed (i.e., $S_{v1}$ assumes the first value, $S_p$ assumes the first value and $S_{v2}$ assumes the second value, as shown at instant $t_5$), so that air is sucked from the external environment towards the part of the fluidic channel 25 comprised between the first and second valves 32 and 36; and f) closing the first valve 32, leaving the micro-pump 34 inactive and leaving the second valve 36 closed (i.e., $S_{v1}$ assumes the second value, $S_p$ assumes the first value and $S_{v2}$ assumes the second value, as shown at instant $t_6$), so as to pneumatically insulate the part of the fluidic channel 25 comprised between the first and second valves 32 and 36 both from the external environment and from the internal space 24.

By repeating steps a-f, and therefore performing multiple iterations of the control method, the amount of air in the internal space 24 may be progressively increased, and therefore the strainable structure 20 may be increasingly strained to increase the maximum elongation dimension $D_{all}$ thereof.

With reference to FIGS. 7A-7I, a manufacturing process of the MEMS actuator 10 is now described, according to an embodiment.

In detail, FIG. 7A shows a first wafer 50 of semiconductor material (e.g., silicon) for forming the first substrate 40. The first wafer 50 has a first surface 50a and a second surface 50b, opposite to each other along the Z-axis.

With reference to FIG. 7B, a first buried cavity 52 is formed at the first surface 50a of the first wafer 50. The first buried cavity 52 has an annular shape (in detail, a donut shape) parallel to the XY-plane, and a first connecting region 51 of the first wafer 50 for forming the first connecting portion 23a extends centrally thereto. In particular, the first connecting region 51 has the first maximum external dimension $D_{e,1}$ parallel to the XY-plane, while the first buried cavity 52 has a first maximum cavity dimension $D_{c,1}$ parallel to the XY-plane (e.g., measured between side walls of the first buried cavity 52 which are opposite to each other along the X-axis or Y-axis) being greater than the first maximum external dimension $D_{e,1}$. For example, in the exemplarily considered embodiment wherein the first buried cavity 52 has a circular shape, the first maximum cavity dimension $D_{c,1}$ coincides with a greater diameter than the annular section formed by the first buried cavity 52, while the first maximum external dimension $D_{e,1}$ coincides with a smaller diameter than the annular section formed by the first buried cavity 52.

In detail, the first buried cavity 52 is formed using the well-known "VenSen" process (also called "Venice" process, and disclosed for example in U.S. Pat. No. 7,294,536 and United States Patent Publication No. 2008/0261345, the contents of both of which are incorporated by reference in their entirety). In greater detail, work trenches (not shown) are formed in a region of the first surface 50a of the first wafer 50 intended to become the first buried cavity 52. A group of work trenches that delimit a respective plurality of pillars (not shown) of semiconductor material are formed in this region of the first wafer 50, for example using known lithographic and selective etching steps. An epitaxial layer (not shown) is grown, through an epitaxial growth step, on the first surface 50a of the first wafer 50 (which therefore increases in thickness), having work trenches facing thereto. One or more thermal annealing steps of the first wafer 50 are then performed, for example in a reducing environment (e.g., in a hydrogen atmosphere) and at high temperatures (e.g., higher than 1000° C.). The one or more thermal annealing steps cause a migration of the semiconductor atoms, here silicon, which tend to move to a position of lower energy: consequently, the semiconductor atoms of the pillars migrate completely, forming the first buried cavity 52. The buried cavity 52 is therefore delimited upwardly by a semiconductor layer formed partly by epitaxially grown atoms and partly by migrated atoms; this semiconductor layer forms a closing layer of the first wafer 50 and provides a new first surface of the first wafer 50 (the first surface of the first wafer 50 of FIG. 7B being superimposed, along the Z-axis, on the first surface 50a of the first wafer 50 of FIG. 7A and being opposite to the second surface 50b of the first wafer 50 along the Z-axis, and therefore being indicated again with the reference 50a).

With reference to FIG. 7C, a second buried cavity 54 is formed at the first surface 50a of the first wafer 50 of FIG. 7B, through the previously described VenSen process. The second buried cavity 54 is superimposed, along the Z-axis, on the first buried cavity 52 and is for forming the first internal subspace 26'. The second buried cavity 54 has the second maximum internal dimension $D_{i,2}$ parallel to the XY-plane and in particular, in the present embodiment, has a circular shape.

With reference to FIG. 7D, a third buried cavity 56 is formed at the first surface 50a of the first wafer 50 of FIG. 7C, through the VenSen process. The third buried cavity 56 is superimposed, along the Z-axis, on the second buried cavity 54 and is similar to the first buried cavity 52 and therefore is not described again in detail; furthermore, a second connecting region 55 of the first wafer 50 for forming the second connecting portion 23c extends centrally to the third buried cavity 56.

With reference to FIG. 7E, a fourth buried cavity 58 is formed at the first surface 50a of the first wafer 50 of FIG. 7D, through the VenSen process. The fourth buried cavity 58 is superimposed, along the Z-axis, on the third buried cavity 56 and is for forming the second internal subspace 26". The fourth buried cavity 58 is similar to the second buried cavity 54 and therefore is not described again in detail. The first wafer 50, at the end of the step of FIG. 7E, defines the first substrate 40, where the second surface 40b of the substrate 40 coincides with the second surface 50a of the first wafer 50 and the first surface 40a of the substrate 40 coincides with the first surface 50a of the first wafer 50 of FIG. 7E.

Optionally, in the step shown in FIG. 7E the buried cavities (or fifth buried cavities) 39 of the first valve 32, of the micro-pump 34 and of the second valve 36 are also formed, through the VenSen process, e.g., while forming the fourth buried cavity 58. In detail, the buried cavities 39 extend laterally to the fourth buried cavity 58, in regions of the first surface 50a of the first wafer 50 of FIG. 7D for accommodating the first valve 32, the micro-pump 34 and the second valve 36. In greater detail, the buried cavities 39 extend at the same level as the fourth buried cavity 58 along the Z-axis.

In the (optional) manufacturing step shown in FIG. 7F, the actuation structures 37 of the first valve 32, of the micro-pump 34 and of the second valve 36 are formed, according to suitable manufacturing techniques known to those of ordinary skill in the art. In particular, the actuation structures 37 are formed on the respective buried cavities 39, i.e., are superimposed, along the Z-axis, on the latter.

Figure 7G:
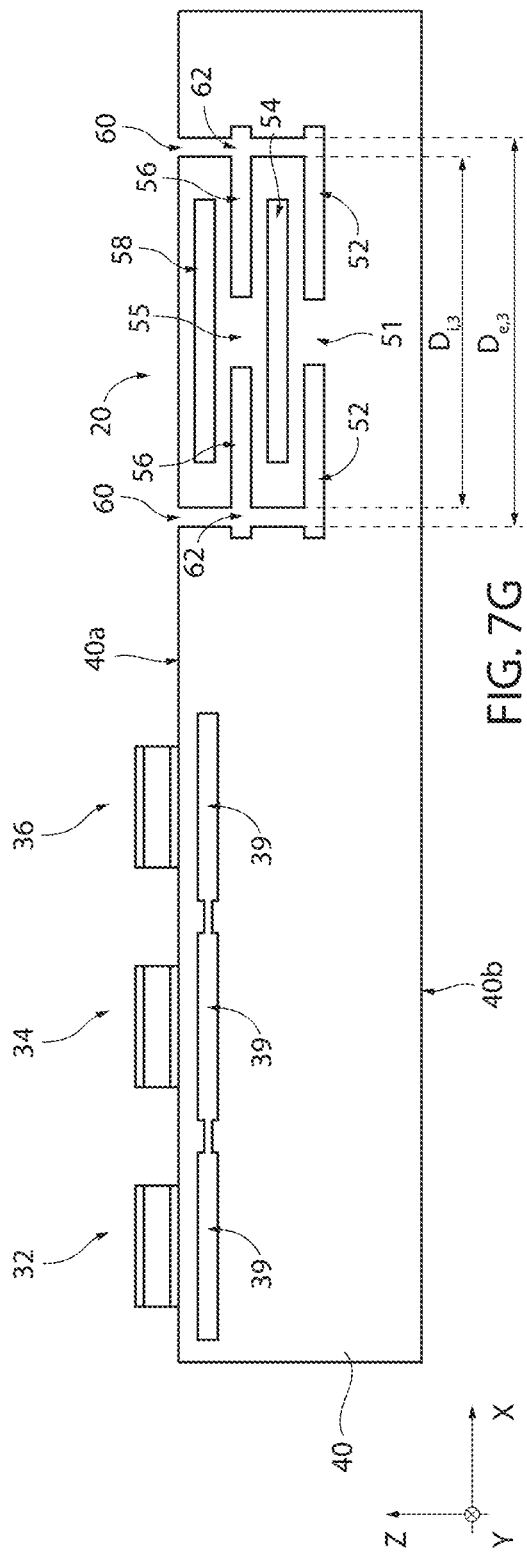

With reference to FIG. 7G, a first etching (in detail, a chemical dry etching, such as a deep reactive ion etching, for example through fluorides such as $XeF_2$) is performed on the first substrate 40 to form the housing cavity 22 and therefore to externally define the strainable structure 20. In detail, the first etching is performed in a second exposed region 60 of the first surface 40a of the first substrate 40, which has an annular shape and which is superimposed, along the Z-axis, on the buried cavities 52-58. The second exposed region 60 of the first surface 40a remains exposed from a photoresist layer (not shown) which is deposited on the first surface 40a of the first substrate 40 to operate as a mask for the first etching. In greater detail, the second exposed region 60 has an annular section parallel to the XY-plane defined by a third maximum internal dimension $D_{i,3}$ (measured parallel to the XY-plane, for example along the X-axis, and equal to the second maximum external dimension $D_{e,2}$) and by a third maximum external dimension $D_{e,3}$ (measured parallel to the XY-plane, for example along the X-axis) being greater than the third maximum internal dimension $D_{i,3}$. In the exemplarily considered embodiment wherein the strainable structure 20 has a circular shape in the XY-plane, the third maximum internal dimension $D_{i,3}$ coincides with a smaller diameter than the annular section formed by the second exposed region 60, while the third maximum external dimension $D_{e,3}$ coincides with a greater diameter than the annular section formed by the second exposed region 60.

In detail, the first etching of FIG. 7G is performed so as to form a first trench 62 with an annular shape which extends from the first surface 40a of the first substrate 40 towards the second surface 40b of the first substrate 40, without reaching the latter. In particular, the first trench 62 extends from the first surface 40a of the first substrate 40 through the third buried cavity 56 until reaching the first buried cavity 52, putting both the first buried cavity 52 and the third buried cavity 56 in fluidic communication with the external environment. The first trench 62, the first buried cavity 52 and the third buried cavity 56 are therefore joined to each other and form the housing cavity 22 which physically separates the strainable structure 20 from the first substrate 40, having the strainable structure 20 coupled thereto through the first connecting portion 23a.

Figure 7H:
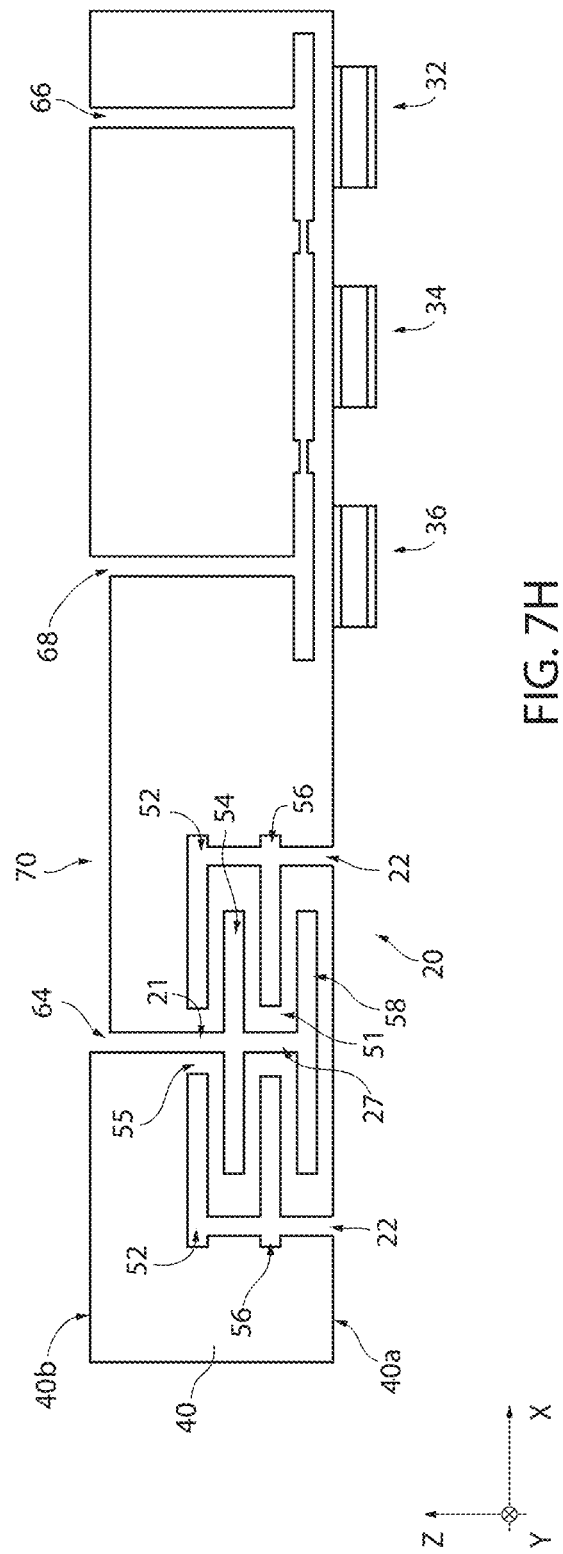

With reference to FIG. 7H, a second etching (in detail, chemical dry etching, such as deep reactive ion etching, for example through fluorides such as $XeF_2$) is performed on the first substrate 40 to form the fluidic channel 25 and to internally define the strainable structure 20. The second etching is performed on the second surface 40b of the first substrate 40, and forms a second trench 64 which extends along the Z-axis from the second surface 40b of the first substrate 40 up to the fourth buried cavity 58, through the first and second connecting regions 51 and 55. In other words, in the present embodiment the second trench 64 extends centrally with respect to the buried cavities 52-58. Consequently, the second trench 64 forms the opening 21 and the communication hole 27, so to put the second and fourth buried cavities 54 and 58 in fluidic communication both with each other and with the external environment, thus forming the internal space 24. Furthermore, the second trench 64 forms part of the fluidic channel 25, and in detail forms the first end 25' of the fluidic channel 25.

Optionally, the etching of FIG. 7H also forms: a third trench 66 which extends from the second surface 40b of the first substrate 40 to the buried cavity 39 of the first valve 32, and which forms the first portion 25a of the fluidic channel 25; a fourth trench 68 which extends from the second surface 40b of the first substrate 40 to the buried cavity 39 of the second valve 36, and which forms the second portion 25b of the fluidic channel 25; and an exposed cavity 70 facing the second surface 40b of the first substrate 40, which extends along the X-axis between the second trench 64 and the fourth trench 68 and which is for forming the third portion 25c of the fluidic channel 25.

Figure 7I:
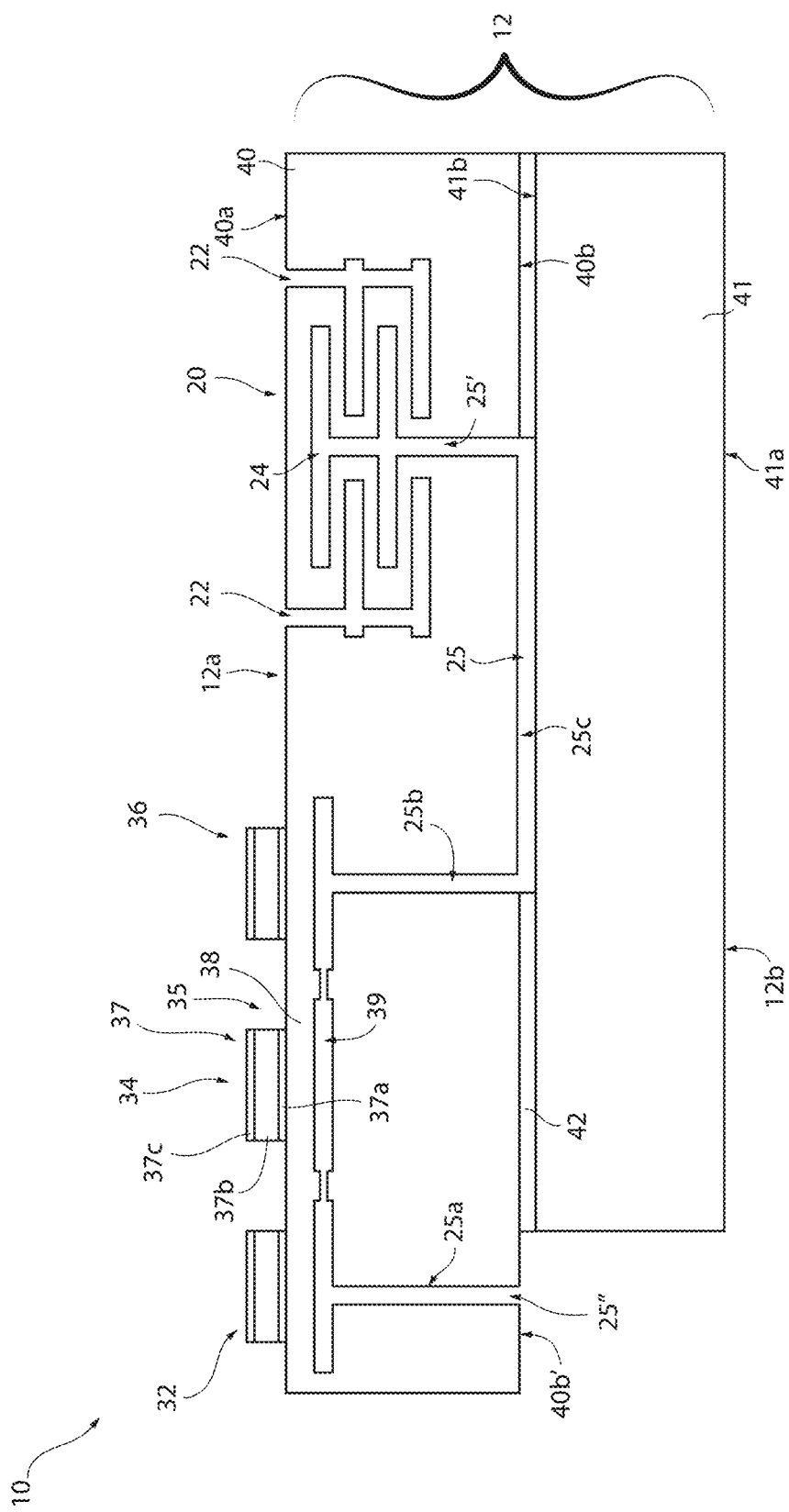

With reference to FIG. 7I (optional step), a second wafer of semiconductor material (e.g., silicon) forms the second substrate 41 and is bonded to the first substrate 40, for example by gluing. In detail, the bonding layer 42 is deposited, according to suitable techniques known to those of ordinary skill in the art, between the second surfaces 40b and 41b of the first and the second substrates 40 and 41 so as to mutually glue them together. This allows the exposed cavity 70 to be closed, thus forming the third portion 25c of the fluidic channel 25. Furthermore, the substrates 40 and 41 are coupled to each other so that they do not to obstruct the second end 25" of the fluidic channel 25, which remains facing the external environment. Consequently, the internal space 24 is in fluidic communication with the external environment through the fluidic channel 25 having the pumping assembly 30 extending therethrough.

From an examination of the characteristics described herein, the advantages that this disclosure affords are evident.

In particular, the strainable structure 20 allows greater elongations and actuation forces to be achieved with respect to those of MEMS actuators of known type, for example based on piezoelectric technologies. In detail, the actuation force $F_{att}$ that may be exerted by the strainable structure 20 is for example comprised between 300 mN and 500 mN.

This is allowed both thanks to the shape of the strainable structure 20 and to the pumping assembly 30 which may efficiently pump a large amount of air into the internal space 24.

Furthermore, the strainable structure 20 and the pumping assembly 30 are integrated into the MEMS actuator 10, which has small dimensions (e.g., of the order of hundreds of μm).

Furthermore, the previously described manufacturing process allows the MEMS actuator 10 to be manufactured in a simple and economical manner.

Finally, it is clear that modifications and variations may be made without thereby departing from the scope of this disclosure. For example, the different embodiments described herein may be combined with each other to provide further embodiments and configurations.

Figure 8:
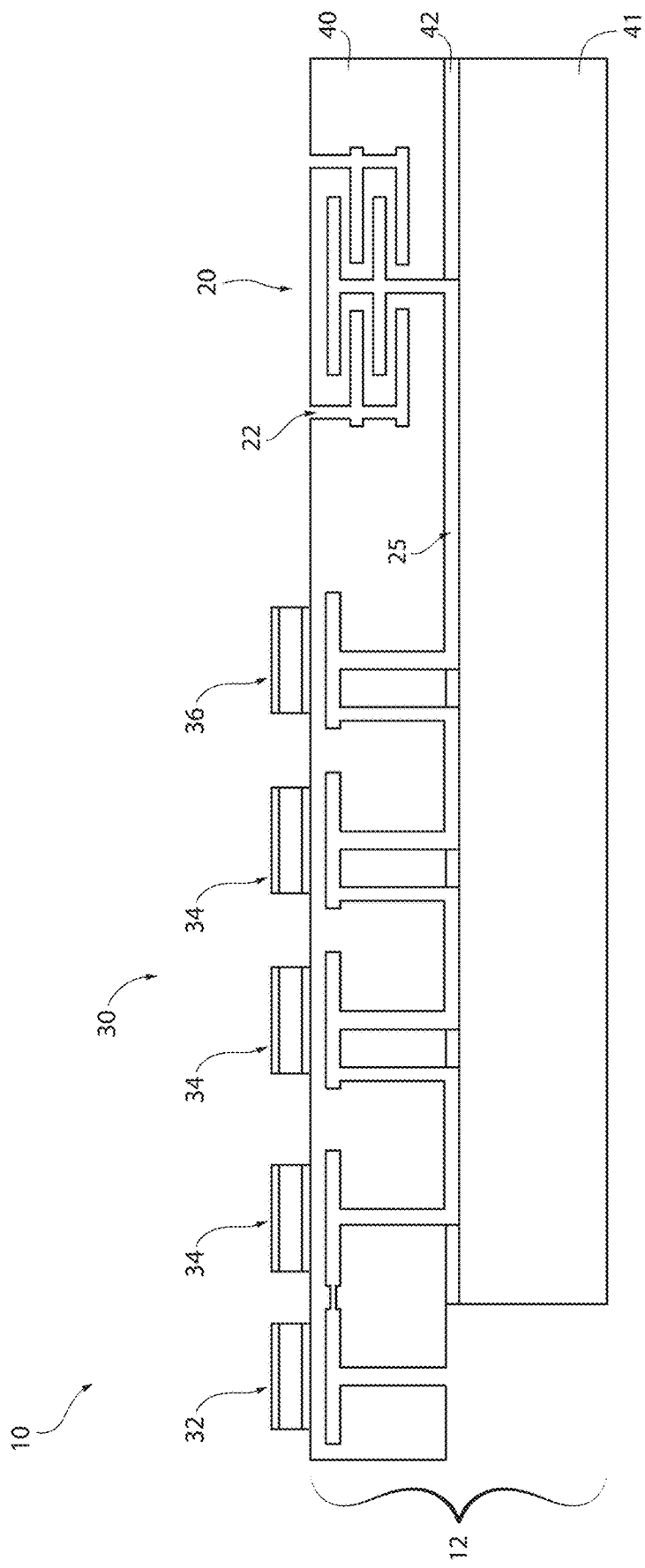
FIGS. 8 and 9 are lateral cross-section views of different embodiments of the MEMS actuator.

Furthermore, the pumping assembly 30 may have more than one micro-pump 34, as shown in the embodiment of FIG. 8. In this case, the micro-pumps 34 are arranged in series with each other along the fluidic channel 25, between the first and second valves 32 and 36. The plurality of micro-pumps 34 allow the air pumping capacity of the pumping assembly 30 to be improved, increasing the pressure applicable to the air present between the first and second valves 32 and 36.

Figure 9:
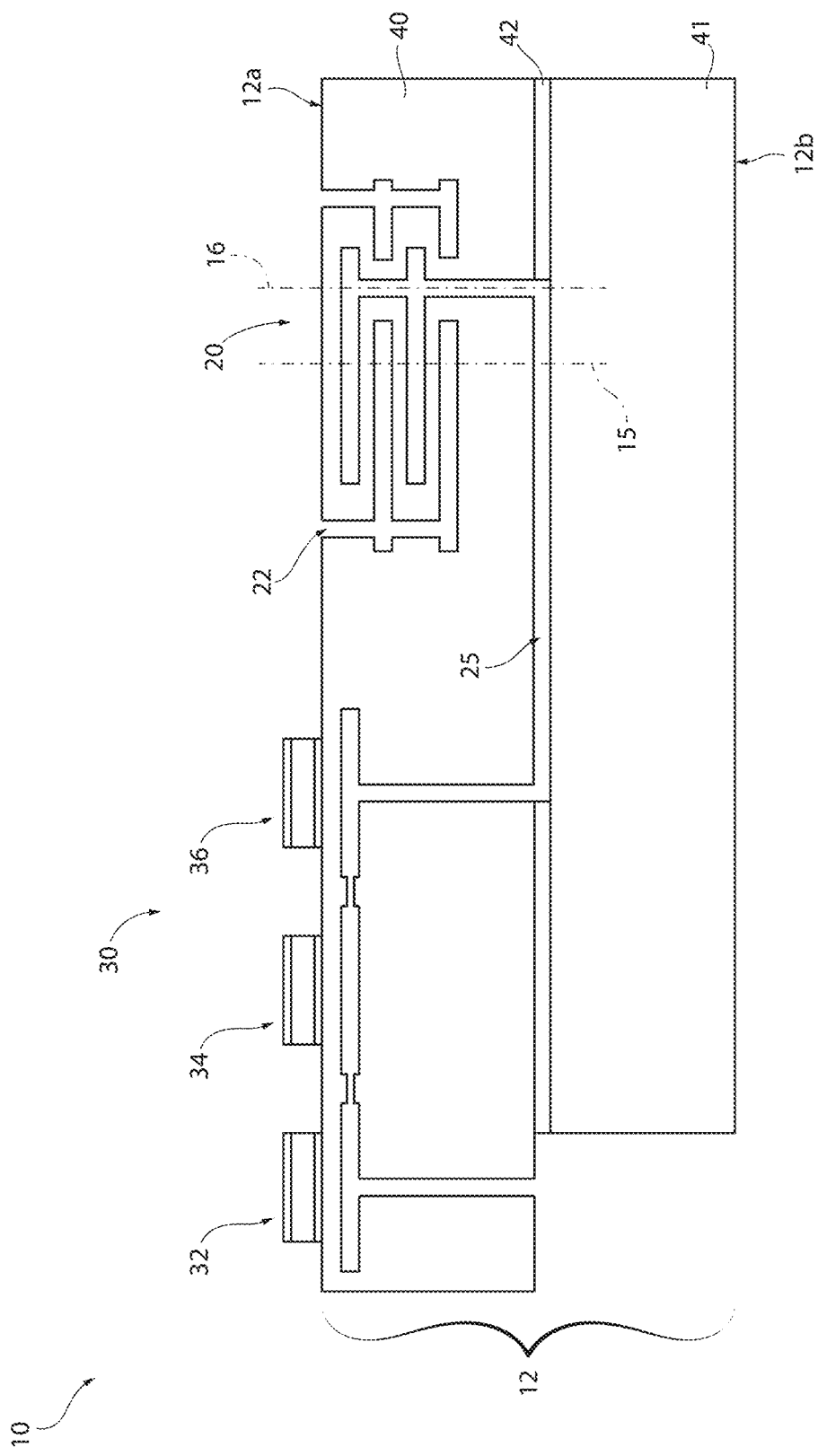

The strainable structure 20 may be asymmetrical in the XZ-plane. In other words, as shown in FIG. 9, the fluidic communication hole 27 and the opening 21 are aligned with each other along the symmetry axis 16 which, in the present embodiment, is parallel to the Z-axis but different (not coincident) from the centerline axis 15. Therefore, the fluidic communication hole 27 and the opening 21 are off-center in the XY-plane with respect to the centerline axis 15, and are laterally offset with respect to a center (e.g., barycenter) in the XY-plane of the top surface 23e of the strainable structure 20. Furthermore, the first connecting portion 23a and the second connecting portion 23c are concentric with each other, symmetrical with respect to the symmetry axis 16, and eccentric with respect to the centerline axis 15 of the strainable structure 20, here different from the symmetry axis 16. Consequently, the strain of the strainable structure 20 is also asymmetrical, and in particular the top surface 23e of the strainable structure 20 tilts transversely to the first surface 12a of the semiconductor body 12 when the strainable structure 20 strains due to the pumping of air into the internal space 24 (as it may also be seen in FIG. 10). In this manner, a maximum elongation dimension $D_{all}$ may also be achieved being greater with respect to the case of the symmetrical strainable structure 20, with the same applied pumping capacity and dimensions of the MEMS actuator 10.

Figure 10:
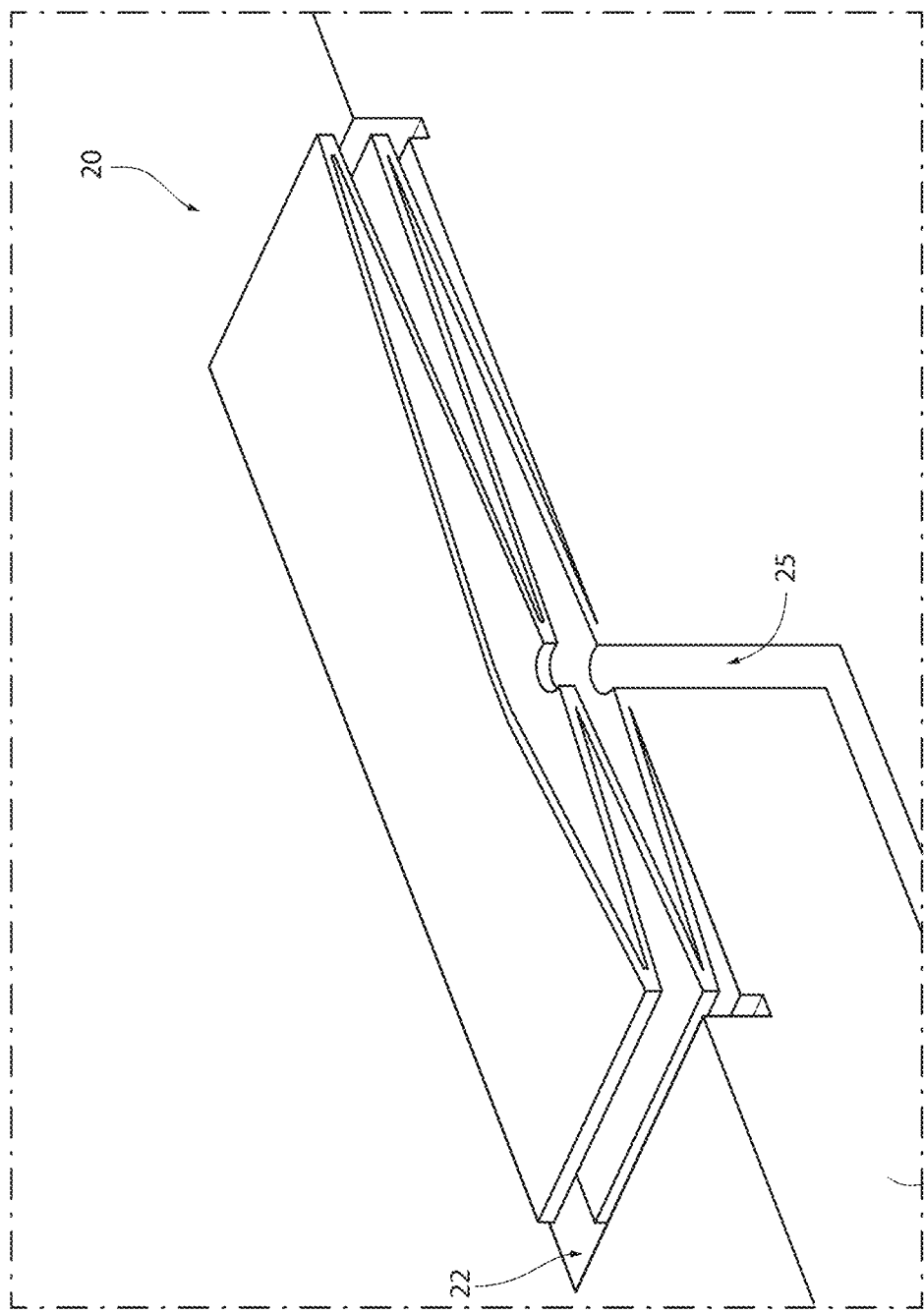
FIG. 10 is a perspective section of a different embodiment for the strainable structure of the MEMS actuator.

As shown in FIG. 10, the strainable structure 20 may also have shapes, in the XY-plane, other than the circular shape, and for example a rectangular shape. Examples of other polygonal shapes may be square, hexagonal, octagonal shape, etc.

Furthermore, the strainable structure 20 may comprise more than two straining portions 23b and 23d and more than two connecting portions 23a and 23c, so as to increase the internal space 24 and the ability of the strainable structure 20 to elongate along the Z-axis.

Furthermore, the pumping assembly may also pump a fluid other than air, such as water or oil, into the internal space 24.

The invention claimed is:
1. A MEMS actuator, comprising:
a semiconductor body of semiconductor material having a first surface and a second surface opposite to each other along a first axis, and defining a housing cavity which faces the first surface of the semiconductor body and which has a bottom surface opposite to the first surface of the semiconductor body along the first axis, and one or more lateral surfaces which join the bottom surface of the housing cavity to the first surface of the semiconductor body, the semiconductor body further defining a fluidic channel extending into the semiconductor body and having a first end extending through the bottom surface of the housing cavity; and
a strainable structure which extends into the housing cavity, is coupled to the semiconductor body at the bottom surface of the housing cavity, extends at a distance from the one or more lateral surfaces of the housing cavity, has a top surface opposite to the bottom surface of the housing cavity with respect to the strainable structure, and defines an internal space which faces the first end of the fluidic channel and which comprises at least a first internal subspace and a second internal subspace superimposed on each other along the first axis and pneumatically connected to each other and to the fluidic channel;
wherein the strainable structure has, in section along a first plane orthogonal to the first axis, an annular shape which delimits the internal space radially with respect to the first axis; and
wherein said first internal subspace and second internal substrate are configured to expand in response to a fluid pumped through the fluidic channel to generate an actuation force at the top surface of the strainable structure.

2. The MEMS actuator according to claim 1, wherein the strainable structure is monolithic with the semiconductor body.

3. The MEMS actuator according to claim 1, wherein the strainable structure comprises:
a first connecting portion which joins the strainable structure to the bottom surface of the housing cavity and which defines an opening of the strainable structure, which faces the first end of the fluidic channel and which puts the fluidic channel in fluid communication with the internal space;
a first straining portion which is joined to the first connecting portion and which defines the first internal subspace, the first connecting portion being interposed, along the first axis, between the semiconductor body and the first straining portion;
a second connecting portion which is joined to the first straining portion and which defines a fluidic communication hole which connects the first internal subspace to the second internal subspace, the first straining portion being interposed, along the first axis, between the first connecting portion and the second connecting portion; and
a second straining portion which is joined to the second connecting portion and which defines the second internal subspace, the second connecting portion being interposed, along the first axis, between the first straining portion and the second straining portion;
wherein, when the fluid is pumped through the fluidic channel into the internal space, the first straining portion and the second straining portion strain along the first axis.

4. The MEMS actuator according to claim 3, wherein the strainable structure further comprises:
at least one third connecting portion which is joined to the second straining portion and which defines a further fluidic communication hole which connects the second internal subspace to a third internal subspace of the strainable structure, the second straining portion being interposed, along the first axis, between the second connecting portion and the at least one third connecting portion; and
at least one third straining portion which is joined to the at least one third connecting portion and which defines the third internal subspace, the third connecting portion being interposed, along the first axis, between the second straining portion and the at least one third straining portion;
wherein, when the fluid is pumped through the fluidic channel into the internal space, the first straining portion, the second straining portion and the at least one third straining portion strain along the first axis.

5. The MEMS actuator according to claim 1, wherein the strainable structure has a maximum elongation dimension measured along the first axis between the top surface of the strainable structure and the bottom surface of the housing cavity;
wherein, when the fluid is not pumped into the internal space, the strainable structure is in a rest position, the internal space has a first volume and the maximum elongation dimension has a first value; and
when the fluid is pumped into the internal space, the strainable structure is in an elongation position, the internal space has a second volume being greater than the first volume, and the maximum elongation dimension has a second value being greater than the first value.

6. The MEMS actuator according to claim 1, wherein the fluidic channel has a second end opposite to the first end, and wherein the MEMS actuator further comprises a pumping assembly which extends into the fluidic channel between the first and second ends and is configured to pump the fluid into the internal space of the strainable structure.

7. A MEMS actuator, comprising:
a semiconductor body of semiconductor material having a first surface and a second surface opposite to each other along a first axis, and defining a housing cavity which faces the first surface of the semiconductor body and which has a bottom surface opposite to the first surface of the semiconductor body along the first axis, and one or more lateral surfaces which join the bottom surface of the housing cavity to the first surface of the semiconductor body, the semiconductor body further defining a fluidic channel extending into the semiconductor body and having a first end extending through the bottom surface of the housing cavity; and
a strainable structure which extends into the housing cavity, is coupled to the semiconductor body at the bottom surface of the housing cavity, extends at a distance from the one or more lateral surfaces of the housing cavity, has a top surface opposite to the bottom surface of the housing cavity with respect to the strainable structure, and defines an internal space which faces the first end of the fluidic channel and which comprises at least a first internal subspace and a second internal subspace superimposed on each other along the first axis and pneumatically connected to each other and to the fluidic channel;
wherein said first internal subspace and second internal substrate are configured to expand in response to a fluid pumped through the fluidic channel to generate an actuation force at the top surface of the strainable structure;
wherein the strainable structure comprises:
a first connecting portion which joins the strainable structure to the bottom surface of the housing cavity and which defines an opening of the strainable structure, which faces the first end of the fluidic channel and which puts the fluidic channel in fluid communication with the internal space;
a first straining portion which is joined to the first connecting portion and which defines the first internal subspace, the first connecting portion being interposed, along the first axis, between the semiconductor body and the first straining portion;
a second connecting portion which is joined to the first straining portion and which defines a fluidic communication hole which connects the first internal subspace to the second internal subspace, the first straining portion being interposed, along the first axis, between the first connecting portion and the second connecting portion; and
a second straining portion which is joined to the second connecting portion and which defines the second internal subspace, the second connecting portion being interposed, along the first axis, between the first straining portion and the second straining portion;

wherein, when the fluid is pumped through the fluidic channel into the internal space, the first straining portion and the second straining portion strain along the first axis;

wherein the strainable structure has, in section along a first plane orthogonal to the first axis, an annular shape which delimits the internal space radially with respect to the first axis;

wherein the first and the second connecting portions each have, parallel to the first plane, an annular shape defined by a first maximum internal dimension and by a first maximum external dimension being greater than the first maximum internal dimension, the first maximum internal dimension being measured orthogonally to the first axis between internal surfaces of the first or second connecting portion which are opposite to each other orthogonally to the first axis and face the internal space, and the first maximum external dimension being measured orthogonally to the first axis between external surfaces of the first or second connecting portion which are opposite to each other orthogonally to the first axis and face the housing cavity;

wherein the first and second straining portions each have, at the respective first and second internal subspaces and parallel to the first plane, an annular shape defined by a second maximum internal dimension and by a second maximum external dimension being greater than the second maximum internal dimension, the second maximum internal dimension being measured orthogonally to the first axis between first internal surfaces of the first or second straining portion which are opposite to each other orthogonally to the first axis and face the internal space, and the second maximum external dimension being measured orthogonally to the first axis between first external surfaces of the first or second straining portion which are opposite to each other orthogonally to the first axis and face the housing cavity; and wherein the first maximum external dimension is smaller than the second maximum internal dimension.

8. The MEMS actuator according to claim 7, wherein the first and second connecting portions each have a third maximum external dimension, measured along the first axis between second external surfaces of the first or second connecting portion which are opposite to each other along the first axis and face the housing cavity, being smaller than the second maximum external dimension.

9. The MEMS actuator according to claim 7, wherein the first connecting portion and the second connecting portion are concentric with each other and symmetrical with respect to a symmetry axis coinciding with a centerline axis of the strainable structure, parallel to the first axis, the strainable structure being also symmetrical with respect to the centerline axis.

10. The MEMS actuator according to claim 8, wherein the first connecting portion and the second connecting portion are concentric with each other and symmetrical with respect to a symmetry axis coinciding with a centerline axis of the strainable structure, parallel to the first axis, the strainable structure being also symmetrical with respect to the centerline axis.

11. The MEMS actuator according to claim 7, wherein the first connecting portion and the second connecting portion are concentric with each other, symmetrical with respect to a symmetry axis parallel to the first axis, and eccentric with respect to a centerline axis of the strainable structure, parallel to the first axis and different from the symmetry axis.

12. The MEMS actuator according to claim 8, wherein the first connecting portion and the second connecting portion are concentric with each other, symmetrical with respect to a symmetry axis parallel to the first axis, and eccentric with respect to a centerline axis of the strainable structure, parallel to the first axis and different from the symmetry axis.

13. The MEMS actuator according to claim 7, wherein the strainable structure is monolithic with the semiconductor body.

14. A MEMS actuator, comprising:
 a semiconductor body of semiconductor material having a first surface and a second surface opposite to each other along a first axis, and defining a housing cavity which faces the first surface of the semiconductor body and which has a bottom surface opposite to the first surface of the semiconductor body along the first axis, and one or more lateral surfaces which join the bottom surface of the housing cavity to the first surface of the semiconductor body, the semiconductor body further defining a fluidic channel extending into the semiconductor body and having a first end extending through the bottom surface of the housing cavity; and
 a strainable structure which extends into the housing cavity, is coupled to the semiconductor body at the bottom surface of the housing cavity, extends at a distance from the one or more lateral surfaces of the housing cavity, has a top surface opposite to the bottom surface of the housing cavity with respect to the strainable structure, and defines an internal space which faces the first end of the fluidic channel and which comprises at least a first internal subspace and a second internal subspace superimposed on each other along the first axis and pneumatically connected to each other and to the fluidic channel;
wherein said first internal subspace and second internal substrate are configured to expand in response to a fluid pumped through the fluidic channel to generate an actuation force at the top surface of the strainable structure;
wherein the strainable structure comprises:
 a first connecting portion which joins the strainable structure to the bottom surface of the housing cavity and which defines an opening of the strainable structure, which faces the first end of the fluidic channel and which puts the fluidic channel in fluid communication with the internal space;
 a first straining portion which is joined to the first connecting portion and which defines the first internal subspace, the first connecting portion being interposed, along the first axis, between the semiconductor body and the first straining portion;
 a second connecting portion which is joined to the first straining portion and which defines a fluidic communication hole which connects the first internal subspace to the second internal subspace, the first straining portion being interposed, along the first axis, between the first connecting portion and the second connecting portion; and
 a second straining portion which is joined to the second connecting portion and which defines the second internal subspace, the second connecting portion being interposed, along the first axis, between the first straining portion and the second straining portion;

wherein, when the fluid is pumped through the fluidic channel into the internal space, the first straining portion and the second straining portion strain along the first axis;

wherein the strainable structure has, in section along a first plane orthogonal to the first axis, an annular shape which delimits the internal space radially with respect to the first axis;

wherein the first connecting portion and the second connecting portion are concentric with each other and symmetrical with respect to a symmetry axis coinciding with a centerline axis of the strainable structure, parallel to the first axis, the strainable structure being also symmetrical with respect to the centerline axis.

15. The MEMS actuator according to claim 14, wherein the strainable structure is monolithic with the semiconductor body.

16. A MEMS actuator, comprising:

a semiconductor body of semiconductor material having a first surface and a second surface opposite to each other along a first axis, and defining a housing cavity which faces the first surface of the semiconductor body and which has a bottom surface opposite to the first surface of the semiconductor body along the first axis, and one or more lateral surfaces which join the bottom surface of the housing cavity to the first surface of the semiconductor body, the semiconductor body further defining a fluidic channel extending into the semiconductor body and having a first end extending through the bottom surface of the housing cavity; and a strainable structure which extends into the housing cavity, is coupled to the semiconductor body at the bottom surface of the housing cavity, extends at a distance from the one or more lateral surfaces of the housing cavity, has a top surface opposite to the bottom surface of the housing cavity with respect to the strainable structure, and defines an internal space which faces the first end of the fluidic channel and which comprises at least a first internal subspace and a second internal subspace superimposed on each other along the first axis and pneumatically connected to each other and to the fluidic channel;

wherein said first internal subspace and second internal substrate are configured to expand in response to a fluid pumped through the fluidic channel to generate an actuation force at the top surface of the strainable structure;

wherein the strainable structure comprises:
a first connecting portion which joins the strainable structure to the bottom surface of the housing cavity and which defines an opening of the strainable structure, which faces the first end of the fluidic channel and which puts the fluidic channel in fluid communication with the internal space;

a first straining portion which is joined to the first connecting portion and which defines the first internal subspace, the first connecting portion being interposed, along the first axis, between the semiconductor body and the first straining portion;

a second connecting portion which is joined to the first straining portion and which defines a fluidic communication hole which connects the first internal subspace to the second internal subspace, the first straining portion being interposed, along the first axis, between the first connecting portion and the second connecting portion; and a second straining portion which is joined to the second connecting portion and which defines the second internal subspace, the second connecting portion being interposed, along the first axis, between the first straining portion and the second straining portion;

wherein, when the fluid is pumped through the fluidic channel into the internal space, the first straining portion and the second straining portion strain along the first axis;

wherein the strainable structure has, in section along a first plane orthogonal to the first axis, an annular shape which delimits the internal space radially with respect to the first axis;

wherein the first connecting portion and the second connecting portion are concentric with each other, symmetrical with respect to a symmetry axis parallel to the first axis, and eccentric with respect to a centerline axis of the strainable structure, parallel to the first axis and different from the symmetry axis.

17. A MEMS actuator, comprising:

a semiconductor body of semiconductor material having a first surface and a second surface opposite to each other along a first axis, and defining a housing cavity which faces the first surface of the semiconductor body and which has a bottom surface opposite to the first surface of the semiconductor body along the first axis, and one or more lateral surfaces which join the bottom surface of the housing cavity to the first surface of the semiconductor body, the semiconductor body further defining a fluidic channel extending into the semiconductor body and having a first end extending through the bottom surface of the housing cavity and a second end opposite to the first end; and a strainable structure which extends into the housing cavity, is coupled to the semiconductor body at the bottom surface of the housing cavity, extends at a distance from the one or more lateral surfaces of the housing cavity, has a top surface opposite to the bottom surface of the housing cavity with respect to the strainable structure, and defines an internal space which faces the first end of the fluidic channel and which comprises at least a first internal subspace and a second internal subspace superimposed on each other along the first axis and pneumatically connected to each other and to the fluidic channel;

wherein said first internal subspace and second internal substrate are configured to expand in response to a fluid pumped through the fluidic channel to generate an actuation force at the top surface of the strainable structure;

a pumping assembly which extends into the fluidic channel between the first and second ends and is configured to pump the fluid into the internal space of the strainable structure, the pumping assembly comprising a first valve, a micro-pump and a second valve, the micro-pump extending into the fluidic channel between the first valve and the second valve, and the second valve extending into the fluidic channel between the micro-pump and the strainable structure;

wherein the first and second valves are controllable in an open position, wherein they allow flow of the fluid in the fluidic channel, or in a closed position, wherein they prevent the flow of the fluid in the fluidic channel; and wherein the micro-pump are controllable in a rest position, wherein they do not have any deflection inside the fluidic channel, or in a pumping position, wherein they have deflection inside the fluidic channel.

18. The MEMS actuator according to claim 17, wherein the first valve, the micro-pump and the second valve are of piezoelectric type.

19. A device including the MEMS actuator of claim 17, further comprising a control circuit configured for:
   a) controlling the first valve in the closed position, controlling the micro-pump in the rest position and controlling the second valve in the open position;
   b) controlling the first valve in the closed position, controlling the micro-pump in the pumping position and controlling the second valve in the open position;
   c) controlling the first valve in the closed position, controlling the micro-pump in the pumping position and controlling the second valve in the closed position;
   d) controlling the first valve in the open position, controlling the micro-pump in the pumping position and controlling the second valve in the closed position;
   e) controlling the first valve in the open position, controlling the micro-pump in the rest position and controlling the second valve in the closed position; and
   f) controlling the first valve in the closed position, controlling the micro-pump in the rest position and controlling the second valve in the closed position.

20. The MEMS actuator according to claim 17, wherein the strainable structure is monolithic with the semiconductor body.

21. A MEMS actuator, comprising:
   a semiconductor body of semiconductor material having a first surface and a second surface opposite each other along a first axis, and defining a housing cavity which faces the first surface of the semiconductor body and which has a lower surface, opposite the first surface of the semiconductor body along the first axis, and one or more lateral surfaces which join the lower surface of the housing cavity to the first surface of the semiconductor body, the semiconductor body further defining a fluid channel extending into the semiconductor body and having a first end extending through the lower surface of the housing cavity; and
   a deformable structure that extends into the housing cavity, is coupled to the semiconductor body at the lower surface of the housing cavity, extends away from one or more lateral surfaces of the housing cavity, has an upper surface opposite the lower surface of the housing cavity with respect to the deformable structure, and defines an internal space that faces the first end of the fluid channel and that comprises at least a first internal subspace and a second internal subspace superimposed on each other along the first axis and pneumatically connected to each other and to the fluid channel,
   wherein, when a fluid is pumped through the fluid channel into the internal space, the first internal subspace and the second internal subspace expand by deforming the deformable structure along the first axis and generating an actuation force exerted by the upper surface of the deformable structure along the first axis, in the opposite direction to the housing cavity, and
   wherein the deformable structure has, in section along a first plane orthogonal to the first axis, an annular shape that delimits the internal space radially with respect to the first axis.

* * * * *